(12) United States Patent
Kawano et al.

(10) Patent No.: US 6,404,131 B1
(45) Date of Patent: Jun. 11, 2002

(54) LIGHT EMITTING DISPLAY

(75) Inventors: Tai Kawano; Hidetoshi Yarita, both of Kyoto; Kazuo Kobayashi, Wakayama, all of (JP)

(73) Assignees: Yoshichu Mannequin Co., Ltd., Kyoto; Kazou Kobayashi, Wakayama, both of (JP)

( * ) Notice: Subject to any disclaimer, the term of this patent is extended or adjusted under 35 U.S.C. 154(b) by 0 days.

(21) Appl. No.: 09/634,997

(22) Filed: Aug. 8, 2000

(30) Foreign Application Priority Data

Aug. 9, 1999 (JP) .......................................... 11-224962

(51) Int. Cl.[7] ................................................ B60Q 1/02
(52) U.S. Cl. ........................ 315/82; 315/76; 362/800; 362/245
(58) Field of Search ............................ 315/291, 76, 82, 315/169.3; 313/513, 116; 362/310, 355, 245, 241, 305, 307, 800

(56) References Cited

U.S. PATENT DOCUMENTS

| 5,128,843 | A | * | 7/1992 | Guritz | 362/103 |
| 5,604,480 | A | * | 2/1997 | Lamparter | 340/433 |
| 5,632,551 | A | * | 5/1997 | Roney et al. | 362/249 |
| 5,966,393 | A | * | 10/1999 | Hide et al. | 372/23 |

* cited by examiner

Primary Examiner—Haissa Philogene
Assistant Examiner—Ephrem Alemu
(74) Attorney, Agent, or Firm—Wenderoth, Lind & Ponack, L.L.P.

(57) ABSTRACT

A light emitting display includes a display body made of a light diffusing resin material which comprises a transparent resin doped with a light diffusing material, and an LED lamp having an LED chip encapsulated in a mold member made of a light transmissive material and embedded in the display body with its top facing a front side of the display body. A light reflective surface is disposed on a rear side of the display body to face the front side, and the LED lamp is covered at its top with a light reflective coating.

27 Claims, 25 Drawing Sheets

LIGHT EMITTING DISPLAY

BACKGROUND OF THE INVENTION

1. Field of the Invention

The present invention relates to a light emitting display having an LED lamp as a light source. The term "LED" in this specification means a light emitting diode.

2. Description of the Related Art

It is common to use LEDs in the form of LED lamps which have LED chips (light emitting diodes) enclosed in a mold member.

FIG. 24 is a perspective view showing a conventional LED lamp and FIG. 25 is a schematic cross sectional view of the LED lamp shown in FIG. 24. In FIG. 25, the hatching for expressing the cross section of a mold member is not illustrated.

The conventional LED lamp 2 has an LED chip 5 disposed in a reflector dish 4 mounted to the uppermost end of a cathode 3. The LED chip 5 is electrically connected by a bonding wire 7 to an anode 6. Those components are enclosed in a mold member 8 made of a cylindrical solid form of a transparent material such as epoxy resin.

The top 8a of the mold member 8 of the LED lamp 2 is arranged to form a convex lens of a semi-spherical shape. A pair of lead terminals 9 extending from the cathode 3 and the anode 6 respectively are projected outwardly from the bottom 8b of the mold member 8. The reflector dish 4 has a concave surface thereof provided in an inverted conical shaped recess of the upper side of the cathode 3.

In action, as light of a color attributed to the LED chip material is emitted from the LED chip 5 of the LED lamp 2, it is reflected on the surface of the reflector dish 4 to the front, converged by the lens effect of the top 8a, and radiated to the front. This allows the light to hardly radiate from the bottom 8b and side 8c of the mold member 8. The light radiated from the top 8a is in the form of parallel rays which are slightly dispersed towards the downstream as denoted by the arrows in FIG. 25.

It is known that such an LED lamp as described above is installed in a display body made of a light diffusing resin which comprises a transparent resin doped with a light diffusing material so that light emitted by the LED lamp can radiate from a surface (a light emitting side) of the display body. A characteristic example of the conventional light emitting display is disclosed in Japanese Patent Laid-open Publication (Heisei)1-199513 of the Patent Office in Japan.

However, the conventional light emitting display has a disadvantage that light from the LED lamp is diffused by the action of the light diffusing material as it runs through the display body and when the distance from the top of the LED lamp to the light emitting display surface is short, its diffusion is minimized. This causes the illumination to be varied, brighter in a central region at the top of the LED lamp and darker in the surrounding area.

On the other hand, when the distance from the top of the LED lamp to the light emitting display surface is long, the diffusion of light is relatively satisfied but the intensity of light emitted from the LED lamp is significantly attenuated before reaching the light emitting display surface. Therefore, conventional light emitting display can become dimmed.

Also, as the color of light to be emitted from the light emitting display surface of the conventional light emitting display is strictly determined by the characteristics of the LED lamp as the light source, its variation can hardly be permitted even if desired. It is hence simple and monotonous when a set of the conventional light emitting displays are used for illumination of objects such as in a show-window.

SUMMARY OF THE INVENTION

The present invention has been developed in view of the above aspects and its object is to provide a light emitting display which has an LED lamp as the light source and allows its light emitting display surface to illuminate at uniform brightness throughout the area.

It is another object of the present invention, in addition to the above object, to provide a light emitting display which allows its light emitting display surface to illuminate in different colors regardless of the color of light emitted from its LED lamp.

For achievement of the above object, a light emitting display according to the present invention comprises a light emitting display surface made of a light diffusing resin material which comprises a transparent resin doped with a light diffusing material, an LED lamp having an LED chip encapsulated in a mold member made of a light transmissive material and disposed behind the light emitting display surface with its top facing the light emitting display surface, and a light reflective surface disposed at the rear of the LED lamp to face the light emitting display surface, and in which the LED lamp is covered at its top with a light reflective coating. During operation of the light emitting display, light emitted from the LED lamp is reflected on the inner surface of the light reflective coating on the top of the LED lamp, then reflected again on the light reflective surface behind the LED lamp, and radiated outwardly from the light emitting display surface made of the light diffusing resin material and disposed in front of the LED lamp. Accordingly, the diffusion of emitted light can be enhanced so as to allow the light emitting display surface to illuminate substantially at uniform brightness throughout its area.

Also, a light emitting display is provided comprising a display body made of a light diffusing resin material which comprises a transparent resin doped with a light diffusing material, an LED lamp having an LED chip encapsulated in a mold member made of a light transmissive material and embedded in the display body with its top facing a front side of the display body, and a light reflective surface disposed on a rear side of the display body to face the front side, and in which the LED lamp is covered at its top with a light reflective coating.

Accordingly, the light emitting display can be reduced in the thickness and also allow the display body to illuminate substantially at uniform brightness throughout its surface.

Moreover, a light emitting display is provided comprising a casing with a front plate made of a light diffusing resin material which comprises a transparent resin doped with a light diffusing material, an LED lamp having an LED chip encapsulated in a mold member made of a light transmissive material and mounted in the casing with its top facing the front plate, and a light reflective surface disposed behind the LED lamp on the casing to face the front plate, and in which the LED lamp is covered at its top with a light reflective coating. Accordingly, the pitch between any two adjacent LED lamps can be increased so as to allow the display body to illuminate substantially at uniform brightness throughout its surface.

Alternatively, the light reflective coating covering the top of the LED lamp may be made of a film of an opaque paint. This permits the light reflective coating to be formed easily and efficiently.

Preferably, the paint coating may be a film of a white color paint. This allows the light emitting display surface to illuminate at higher brightness. In addition, the LED lamp can hardly be identified when viewed from the outside.

Alternatively, the LED lamp may have a white-light LED chip and its mold member is covered at the outer surface, excluding at least the top, with a light transmissive tinted coating.

Preferably, the LED lamp may have a white-light LED chip encapsulated in a mold member made of a light transmissive, tinted material. This allows the illumination of a favorable intermediate tone of color which is hardly realized with any conventional LED chip.

Each of the above light emitting displays may be modified with a plurality of the LED lamps which are classified into at least two different types for emitting two different colors of light and arrayed in a combination at equal intervals of a distance or pitch. Accordingly, when the LED lamps are connected to a controller circuit for switching on and off each color group of the LED lamps, the light emitting display can shift the display of illumination from one color to another.

Alternatively, each of the above light emitting displays may be modified with a plurality of the LED lamps which are classified into a red color LED lamp, a green color LED lamp, and a blue color LED lamp and arrayed in a predetermined arrangement. This allows the light emitting display to produce a white color of light in addition to a desired combination of any two colors.

Preferably, each of the above light emitting displays may be modified so that a plurality of the LED lamps, each lamp being a three-color LED lamp having a red color LED chip, a green color LED chip, and a blue color LED chip encapsulated in a single mold member, are provided and arrayed at equal intervals of a distance or pitch. Accordingly, the number of LED lamps can be decreased as compared with each LED lamp having a corresponding LED chip.

DETAILED DESCRIPTION OF THE PREFERRED EMBODIMENTS

The embodiments of the present invention will be described referring to the relevant drawings. It should be understood that the present invention is not limited to the following embodiments.

Embodiment 1

Figure 1:
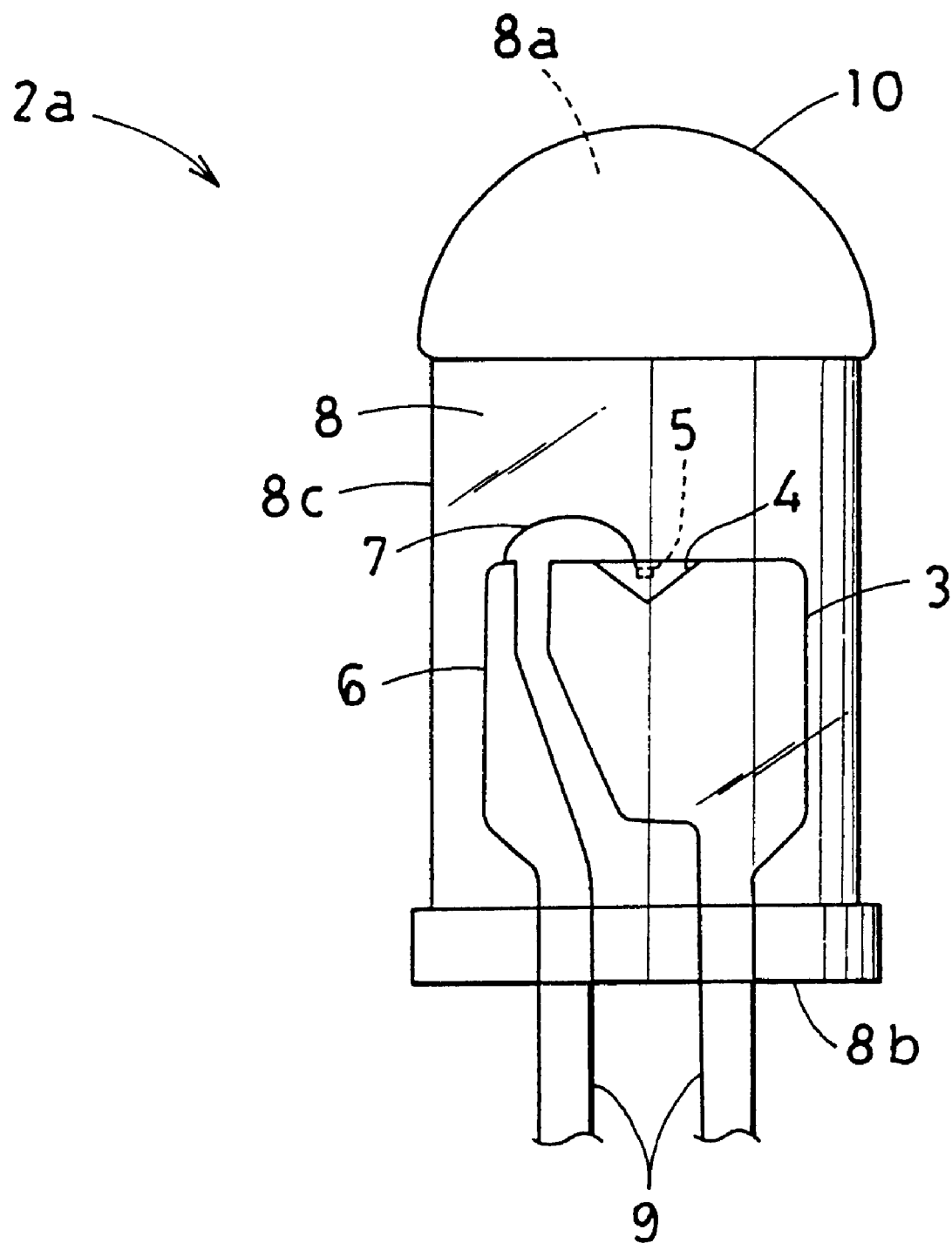
FIG. 1 is a front view of an LED lamp employed in embodiments of the present invention.
Figure 2:
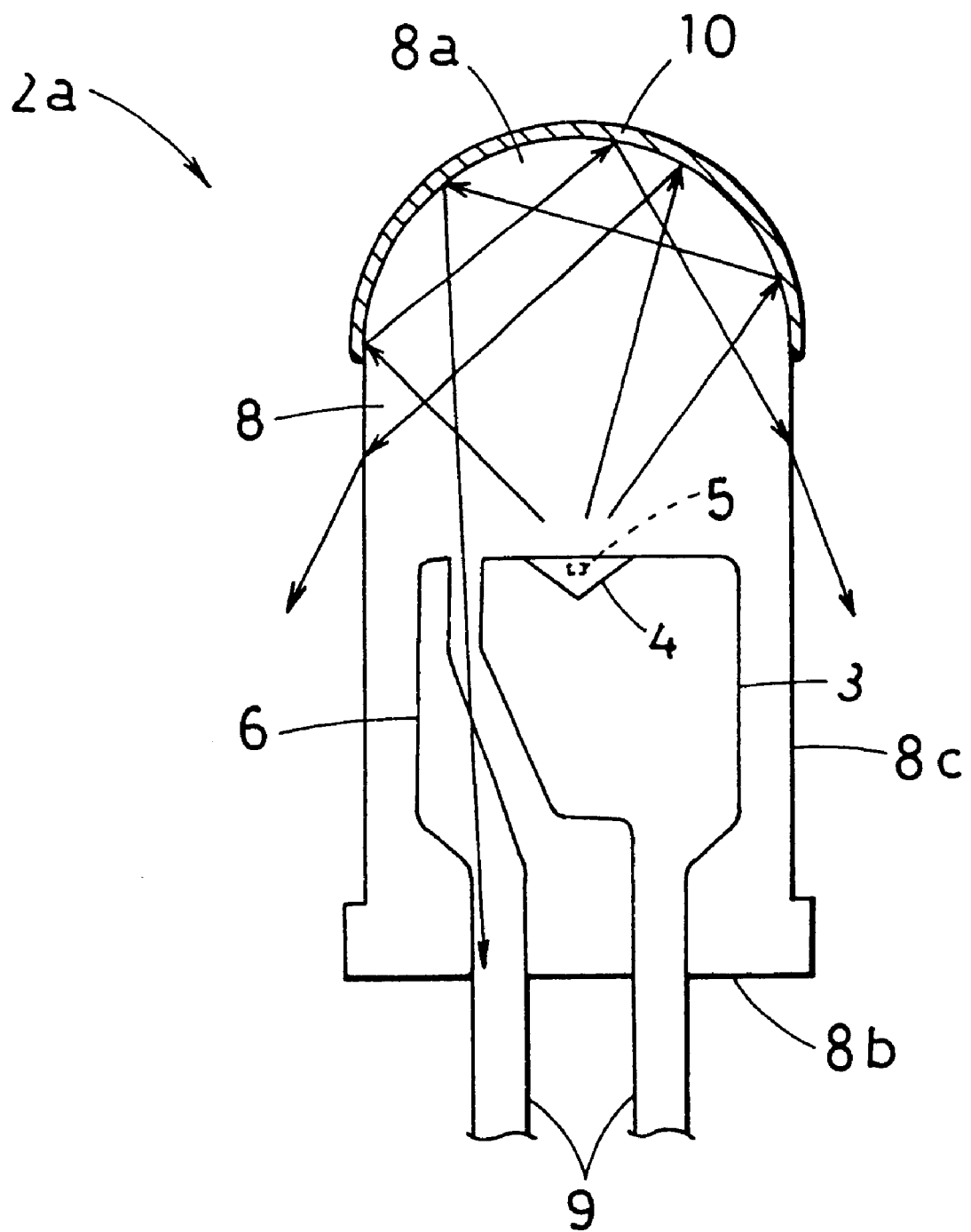
FIG. 2 is a schematically longitudinally cross sectional view of the LED lamp shown in FIG. 1.

An LED lamp employ is first explained referring to FIGS. 1 and 2. As shown in FIG. 2, the hatching for illustrating the cross section of a mold member and the arrangement of bonding wires are not illustrated for simplification.

Figure 24:
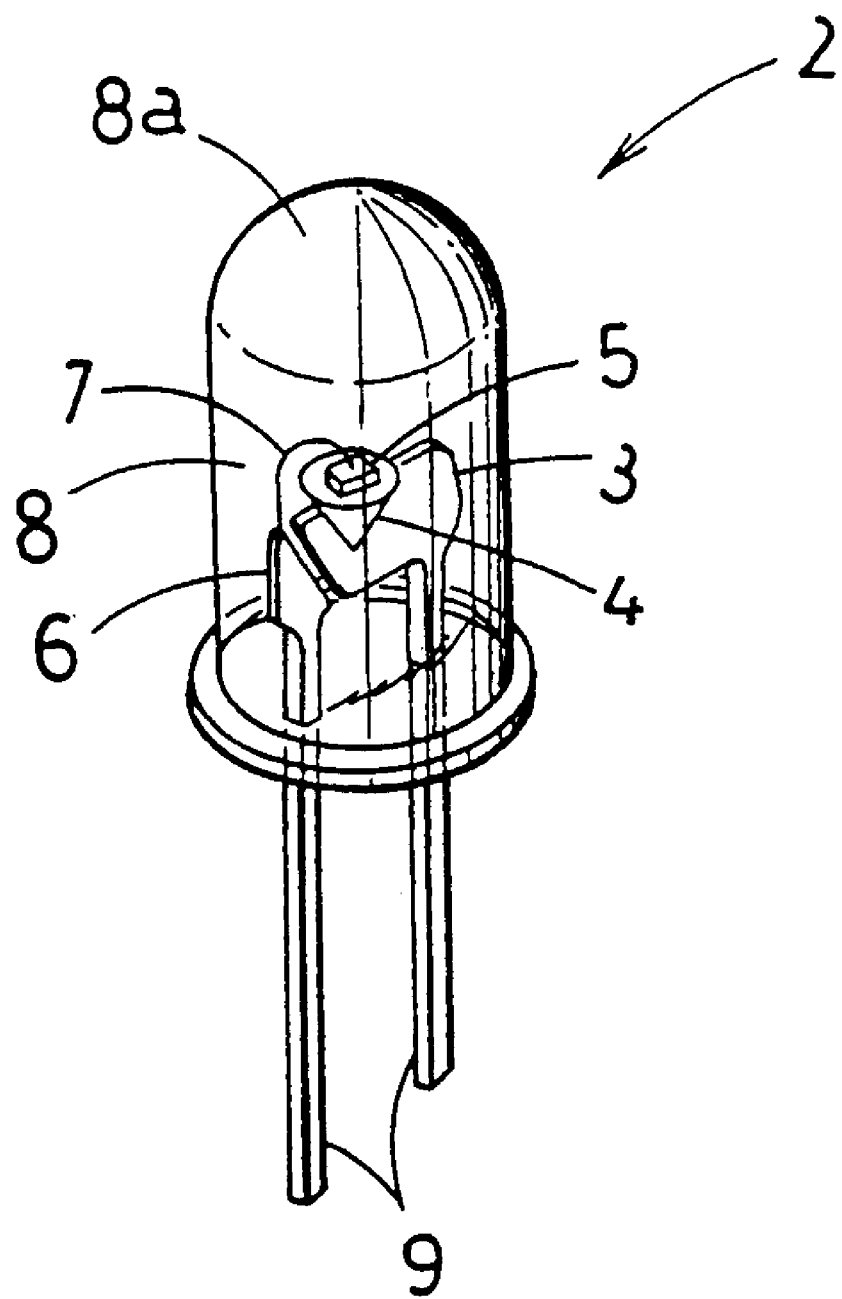
FIG. 24 is a perspective view of a conventional LED lamp.
Figure 25:
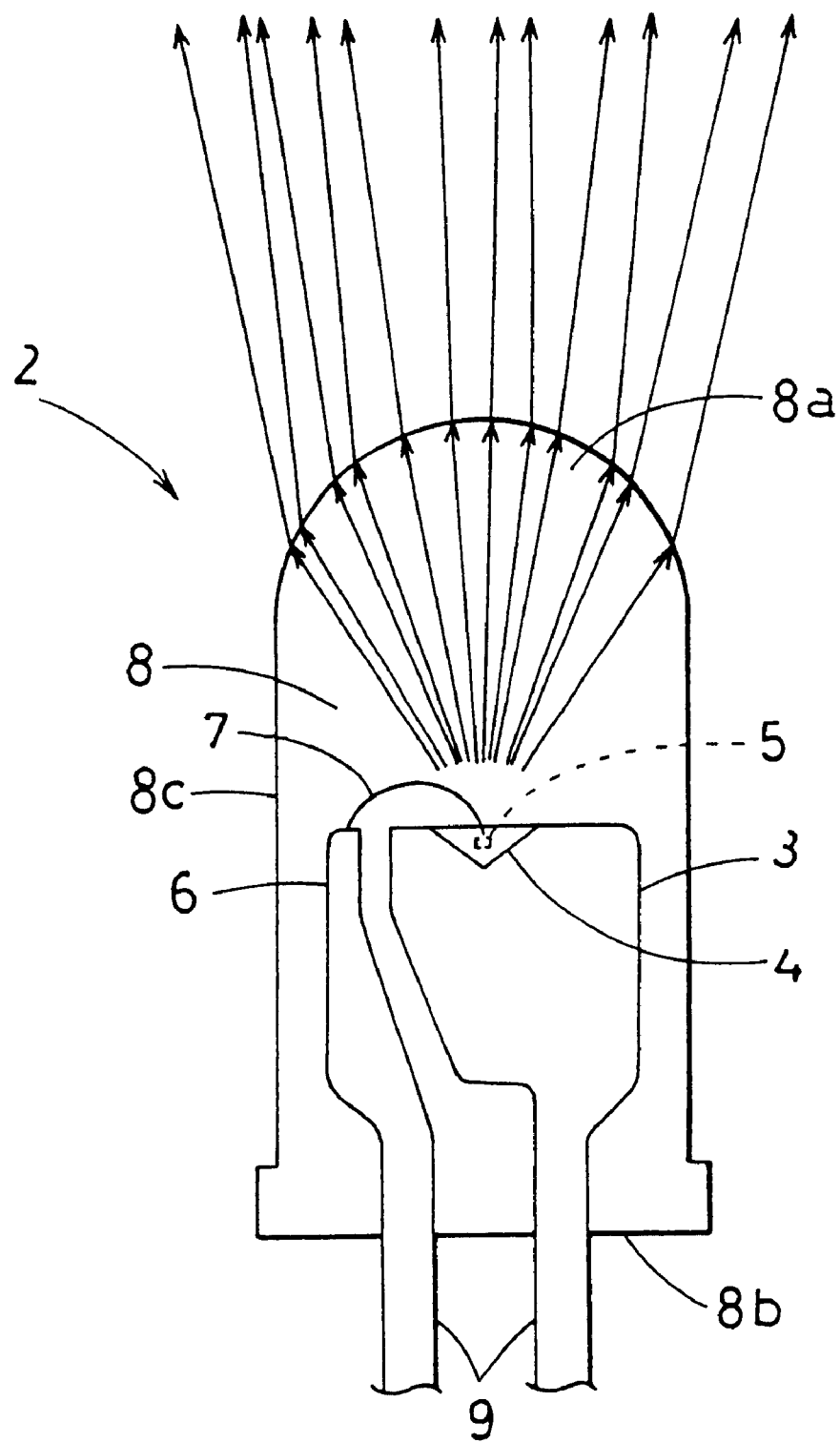
FIG. 25 is a schematically cross sectional view of the LED lamp shown in FIG. 24.

The LED lamp 2a has a top 8a (like the LED lamp 2 shown in FIGS. 24 and 25) covered with a light reflective coating 10. The other arrangement excluding the light reflective coating 10 is identical to that of the previous LED lamp 2. More particularly, a reflector dish 4 located at an uppermost portion of a cathode 3 is recessed to substantially an inverted conical shape, and an LED chip 5 is disposed in the reflector dish 4. The LED chip 5 is electrically connected by a bonding wire 7 to an anode 6. Those components are then enclosed by a mold material 8 of substantially a cylindrical solid form of a transparent material so that the LED chip 5 and the others are sealed off from the outside air. The material of the mold member 8 may preferably be a glass or a transparent resin which has superior resistance to climate such as epoxy resin, urea resin, or silicon resin.

The top 8a of the mold member 8 of the LED lamp 2a is arranged to shape a semi-spherical convex lens. A pair of lead terminals 9 extending downwardly from the cathode 3 and the anode 6 respectively are projected outwardly from the bottom 8b of the mold member 8. When the paired lead terminals 9 are impressed with a direct-current voltage, the LED chip 5 emits light of a color attributed to its material.

The material and shape of the light reflective coating 10 which covers the top 8a of the LED lamp 2a are not limited. For example, a light reflective metal or synthetic resin can be shaped to a cap form matching the external configuration of the top 8a and bonded by an adhesive or the like to the top 8a of the LED lamp 2a to serve as the light reflective coating 10.

However, for ease of the fabrication and its close adhesivity to the top 8a of the mold member 8, the light reflective coating 10 is preferably provided in the form of a layer of an opaque paint.

Figure 3:
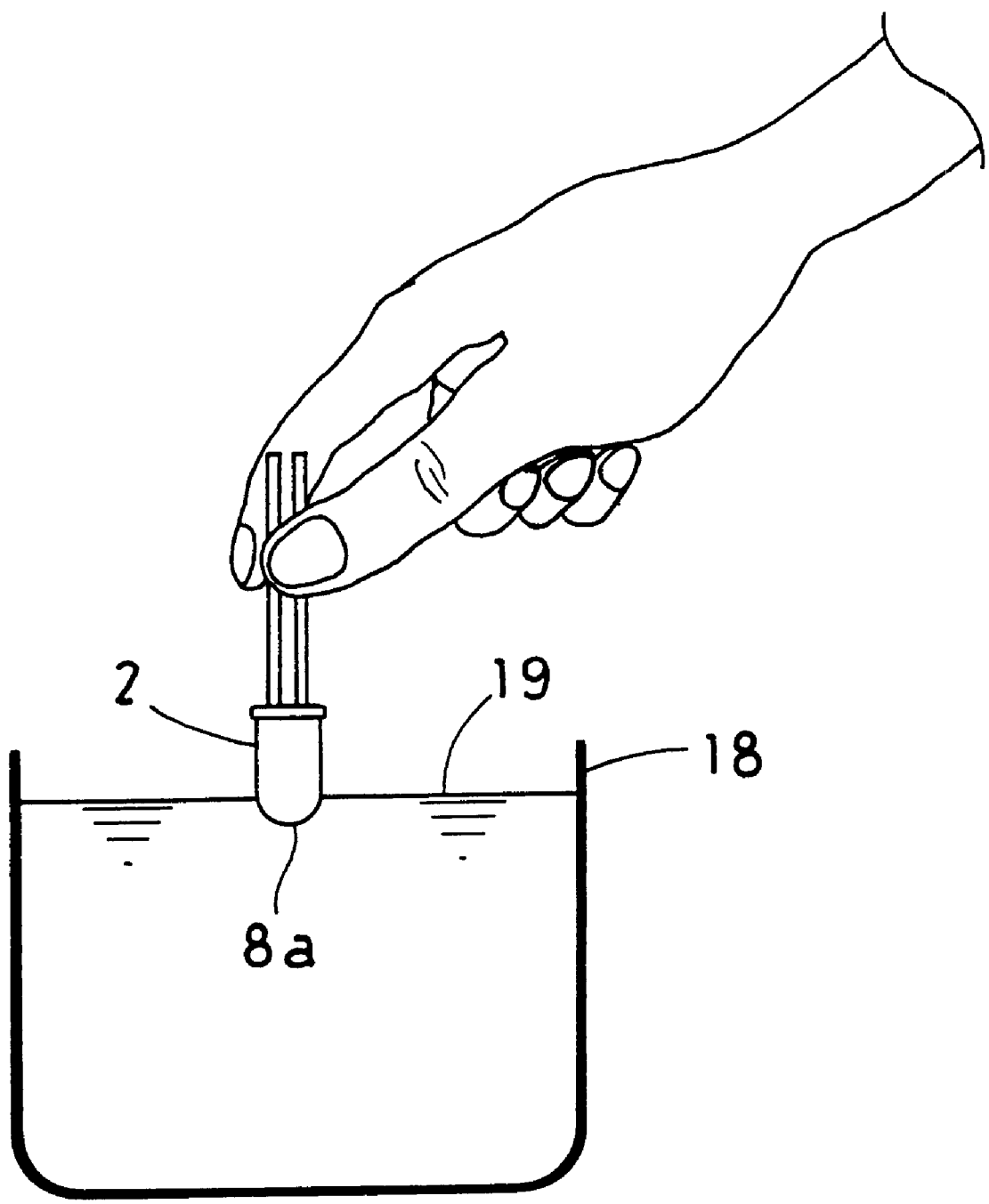
FIG. 3 is an explanatory view illustrating one step of coating the top of the LED lamp with a film.

More specifically, this layer can be applied by, as shown in FIG. 3, filling an appropriate container 18 with an opaque paint 19 such as a coloring agent with pigment, holding the LED lamp 2 upside down, dipping its top 8a into the opaque paint 19, drying and solidifying a coating of the opaque paint 19 on the top 8a to fabricate the LED lamp 2a (with the light reflective coating 10). For mass production, an array of the LED lamps can automatically be held upside down and immersed at their top into an opaque paint bath by the action of a machine, hence increasing the productivity.

The color of the opaque paint 19 is not limited to a particular color but may preferably be thin gray, silver, or, more preferably, white which exhibit a higher reflectivity. With the light reflective coating 10 of a white paint, the light emitting display surface of the light emitting display of the present invention can illuminate at a higher brightness. Also, the light reflective coating 10 of the white paint permits the LED lamp inside the light emitting display to be less visible or hardly identified from the outside.

The above advantage of the light reflective coating 10 is applicable not only to Embodiment 1 but also to the other embodiments of the light emitting display of the present invention.

Figure 4:
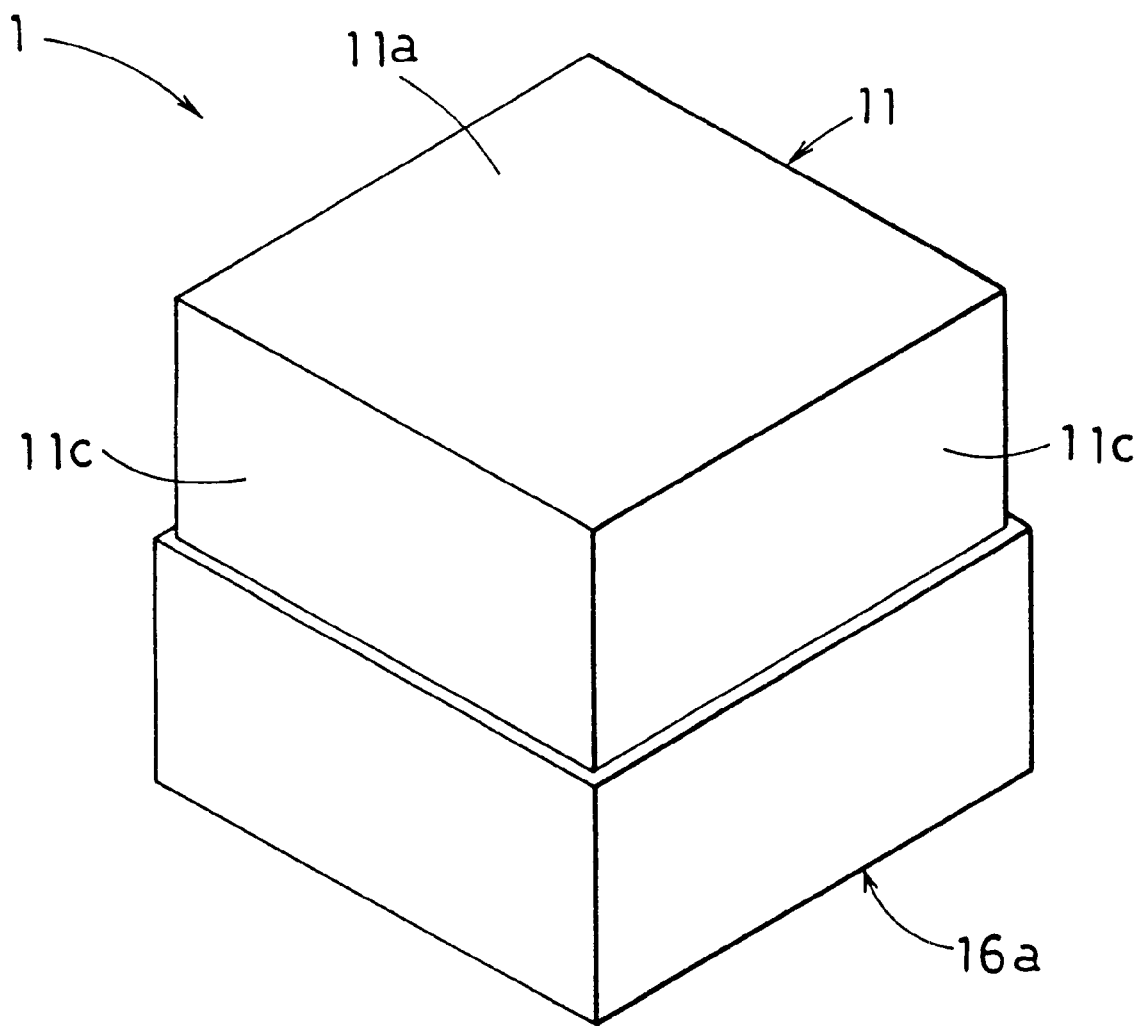
FIG. 4 is a perspective view of a light emitting display according to Embodiment 1 of the present invention.
Figure 5:
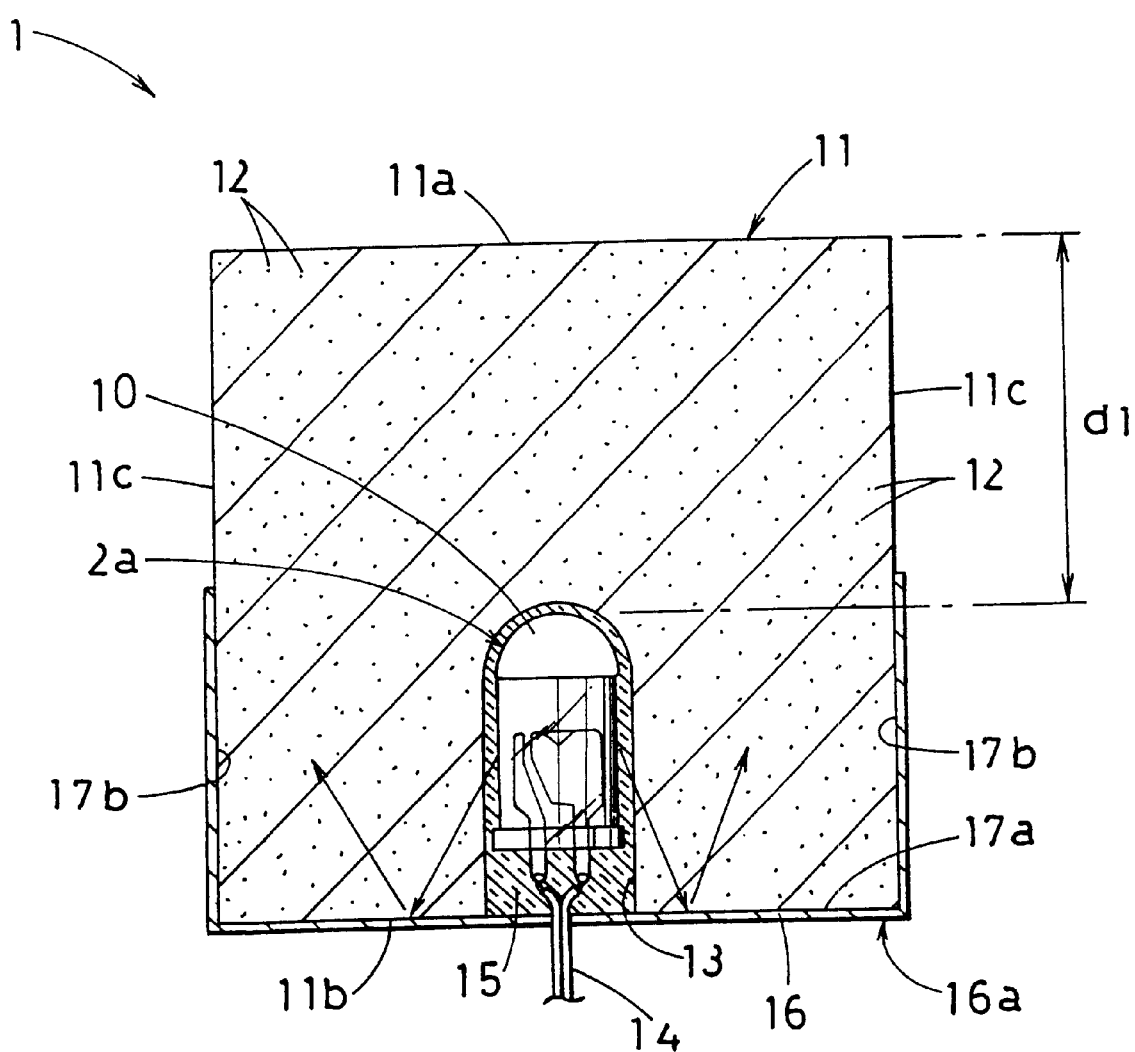
FIG. 5 is a longitudinally cross sectional view of the light emitting display shown in FIG. 4.

The light emitting display of Embodiment 1 employing the LED lamp 2a is explained in more detail referring to FIGS. 4 and 5.

The light emitting display 1 has a display body 11 made of a light diffusion resin material which comprises a transparent resin doped with a light diffusing agent 12.

As for Embodiment 1 and the other embodiments, the transparent resin provided as a base component of the light diffusion resin material of the display body 11 or particularly of a front side of the body is not limited to a specific resin. This resin may be selected from acrylic resin, epoxy resin, urea resin, polycarbonate resin, and other nonopaque resins, and may preferably be an acrylic resin which is less expensive and has a good workability and a higher resistance to climate.

The light diffusing agent added to the transparent resin is also not limited to any particular type but maybe selected from powder forms of silicon oxide, aluminum oxide, titanium oxide, and barium titanate. Alternatively, any other transparent resin (e.g., polyethylene) which is different in the refraction of light from acrylic resin may be used in the form of small particles.

As the transparent resin is doped with a desirable type of the light diffusing agent dispersed, it can act as the light diffusing resin material having a milky white color and a level of light transmissivity.

The display body 11 is a square block cut from a sheet of such a light diffusing resin material. The display body 11 has a lamp accommodating pit 13 provided therein to extend from the rear side 11b toward the front side 11a. The LED lamp 2a is accommodated in the lamp accommodating pit 13 with its pair of lead terminals 9 cut to a length and connected to lead lines 14. For providing water-proof and electrical insulation, a non-color, transparent filler 15 such as transparent epoxy resin is applied to fill the space between the LED lamp 2a and the lamp accommodating pit 13.

Also, the display body 11 having the LED lamp 2a accommodated therein with its top 8a facing the front side 11a is covered at the rear side 11b (the back of the LED lamp 2a) and a lower half of each side 11c with a light reflective coating 16. In Embodiment 1, the light reflective coating 16 is arranged to form a light reflective case 16a of a top-opened square box like shape made of an opaque, white synthetic resin. In other words, the display body 11 is installed and supported by the light reflective case 16a. The bottom and the four sides of the light reflective case 16a incorporate the light reflective coating 16.

As a function of the present invention, the inner wall of the bottom of the light reflective case 16a acts as a light reflective surface 17a opposite to the front side 11a (the light emitting display surface) and the rear side 11b of the display body 11. Similarly, the inner walls of the four side of the light reflective case 16a act as light reflective surfaces 17b covering the lower half of the four sides 11c of the display body 11.

During operation of the light emitting display 1 of Embodiment 1, when a forward voltage from the lead line 14 is applied between the cathode 3 and the anode 6 of the LED lamp 2a, the LED chip 5 emits light of a color attributed to its material. Reflected light on the surface of the reflector dish 4 is then directed in the frontward direction. Upon arriving at the top 8a of the mold member 8, the light is reflected again on the light reflective coating 10.

As the light reflective coating 10 has a concave surface of a substantially semi-circular shape in the cross section, most of the light emitted from the LED chip 5 is reflected rearwardly at angles as denoted by the arrows in FIG. 2 and radiated outwardly through the bottom 8b and the side 8c of the mold member 8. The radiated light from the mold member 8 is a randomly directed light as compared with direct light from the prior art LED lamp 2 which is released through the top 8a in a substantially parallel relationship.

Most of the radiated light from the LED lamp 2a runs rearwardly at angles through the filler 15 and the display body 11 before reaching the light reflective surface 17a behind the LED lamp 2a. As shown in FIG. 5, the light is then reflected once again and runs towards the front. The reflected light is repeatedly diffused by the light diffusing agent 12 and directed in more random directions. As a result, the light is distributed substantially uniformly throughout the display body 11 and finally released out from the light emitting display surface (the front side 11a and the upper half of the four sides 11c not covered with the light reflecting coating 16) of the light emitting display 1.

As described above, the light emitting display 1 permits the light emitted from the LED chip 5 to be hardly radiated to the front or the sides of the LED lamp 2a but to the rear at angles. The rearwardly radiated light is then reflected on the light reflective surface 17a and successfully diffused by the light diffusing agent 12 before reaching the light emitting display surface of the display body 11. Accordingly, when the distance d1 (See FIG. 5) from the top of the LED lamp 2a to the light emitting display surface (at the front side 11a) is as short as 10 mm, the radiated light exhibits a favorable level of diffusion. Therefore, an undesired phenomenon that only a central region of the top of the lamp is intensively illuminated can be eliminated. It is thus possible to allow the light emitting display surface to illuminate substantially at a uniform brightness throughout its area even when the light emitting display 1 is significantly reduced in the thickness.

Because the distance d1 is narrowed to decrease the overall thickness of the display body 11, the attenuation of light propagating from the LED lamp 2a to the light emitting display surface will be minimized hence contributing to the uniform, enhanced illumination of the light emitting display surface.

While the upper half of the four sides 11c as well as the front side 11a of the display body 11 serve as the light emitting display surfaces in Embodiment 1, the light emitting display surface according to the present invention is defined by at least the front side 11a of the display body 11. Another arrangement of the display body 11 having the four sides 11c covered entirely with a light reflecting coating or a light shielding coating may also be used.

Also, while the lower half of the four sides 11c of the display body 11 incorporate the light reflective surfaces 17b in addition to the light reflective surface 17a on the rear side 11b in Embodiment 1, the light reflective surface according to the present invention is defined by at least the rear side 11b of the display body 11. Another arrangement of the display body 11 having no light reflective surfaces provided on the four sides 11c may also be used.

Although the light reflective surfaces 17a and 17b in Embodiment 1 are defined by the inner walls of the light reflective case 16a made of an opaque, white synthetic resin, they may favorably be implemented by any appropriate means. For example, the light reflective surfaces can be implemented by attaching a sheet of light reflective paper or synthetic resin (a light reflective layer) to at least the rear side 11b of the display body 11 or by painting the rear side 11b of the display body 11 with an opaque paint such as in silver color (a light reflective coating).

Embodiment 2

Figure 6:
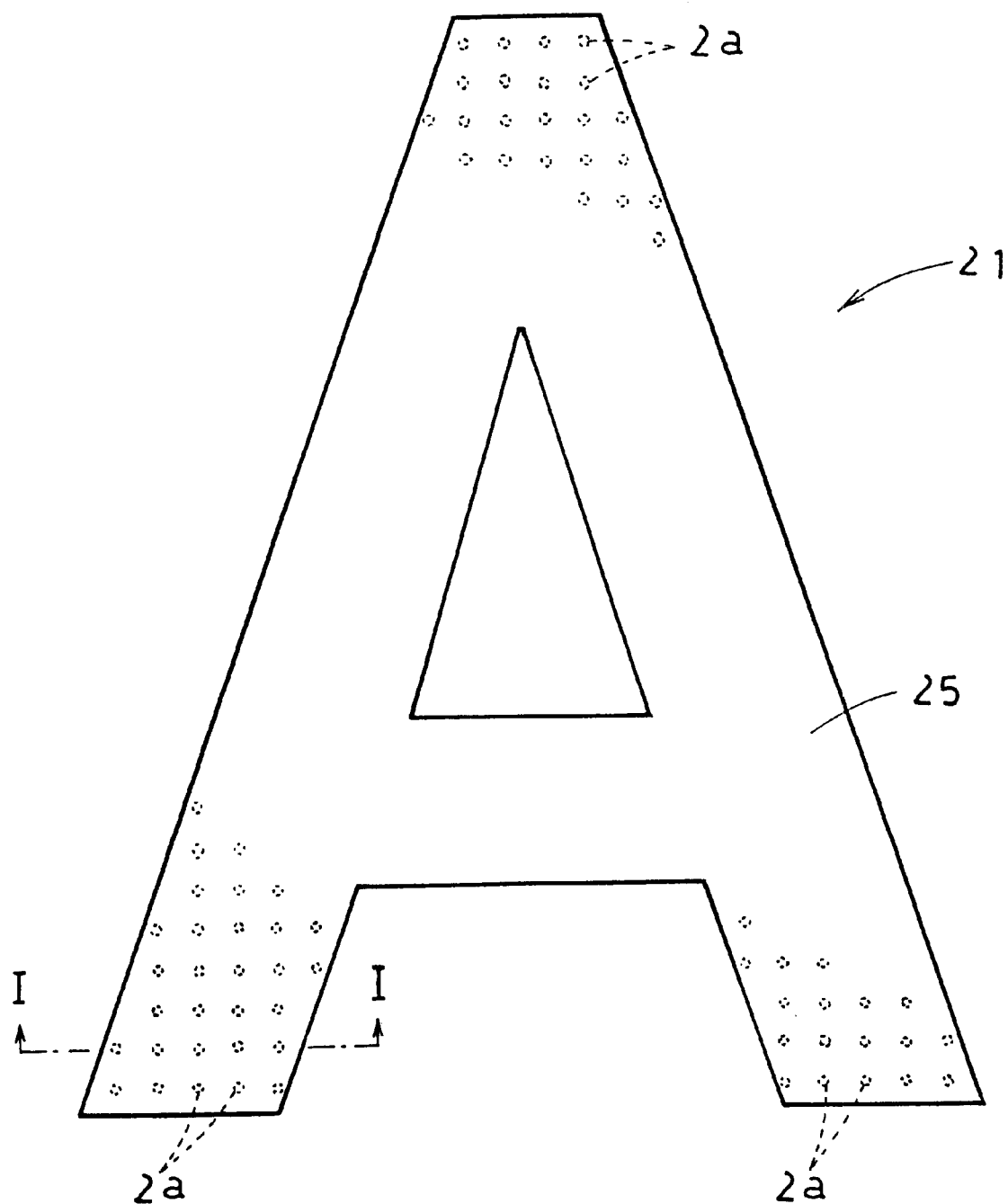
FIG. 6 is a schematic front view of a light emitting display according to Embodiment 2 of the present invention.
Figure 7:
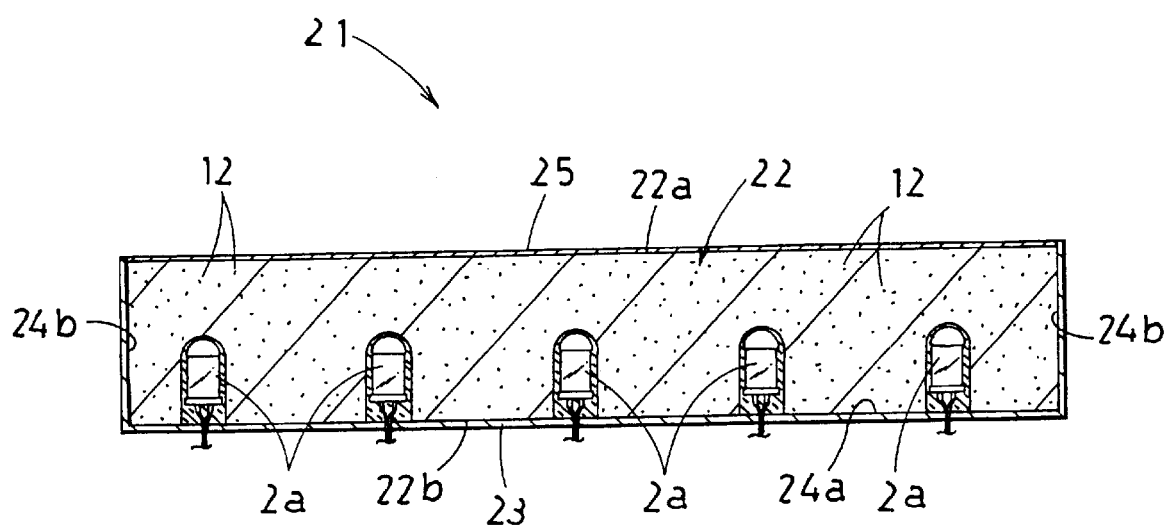
FIG. 7 is an enlarged cross sectional view taken along the line I—I of FIG. 6.

A light emitting display according to Embodiment 2 of the present invention will now be described referring to FIGS. 6 and 7.

The light emitting display 21 of Embodiment 2 is larger in size than that of Embodiment 1 and particularly has a shape of the alphabetical letter A. Its display body 22 is made of a sheet of a milk-white color, light diffusing resin material which comprises a transparent resin doped with a light diffusing agent 12 and has an array of LED lamps 2a identical to that of Embodiment 1 embedded at equal intervals of a distance or pitch, e.g., 20 mm, with their top facing the front side 22a of the display body. The lamp accommodating pit and the filler are also identical to those of Embodiment 1 and will be explained in no more detail.

The display body 22 is covered at its rear side 22b and four side walls with a light reflective coating 23 made of a sheet or strip of an opaque synthetic resin material. The inner sides of the light reflective coating 23 (directly facing the display body 22) incorporate a light reflective surface 24a on the rear side 22b and side light reflective surfaces 24b on the four sides of the display body 22.

The front side 22a of the display body 22 is covered with a color sheet 25 of a transparent or semi-transparent synthetic resin material which is tinted in a color equal to the color of light emitted from the LED lamp 2a.

Meanwhile, the light emitting display surface of the light emitting display 1 of Embodiment 1 appears in a milky white color when the LED lamp 2a is turned off and in a color of the light when the LED lamp 2a is turned on. In some cases, the display of the color which is switched from one to the other between the tun-on and the turn-off may be unfavorable.

The light emitting display 21 of Embodiment 2 has the front side 22a of its display body 22 covered with the light-transmissive color sheet 25. This allows the same color to appear when the illumination is on and off. The light emitting display 21 of this type is favorably applicable to a billboard or the like which remains turned off in the day time and is turned on in the night.

The principle action of light emitted from each LED lamp 2a, reflected on the light reflective surface 24a, and diffused in the display body 22 before reaching the front side 22a is identical to that of the light emitting display 1. As a large number of the LED lamps 2a are arrayed at equal intervals, the color sheet 25 can uniformly be illuminated by the LED lamps 2a throughout its entire area.

The color sheet 25 may be replaced by a coating of light-transmissive color paint on the front side 22a (a light emitting display surface) of the display body 22 with equal success.

Also, the benefits of this invention will substantially be provided with a coloring agent added to the light diffusing agent 12 to tint the light diffusing resin material of the display body 22 in the same color as the illumination of the LED lamps 2a.

Embodiment 3

Figure 8:
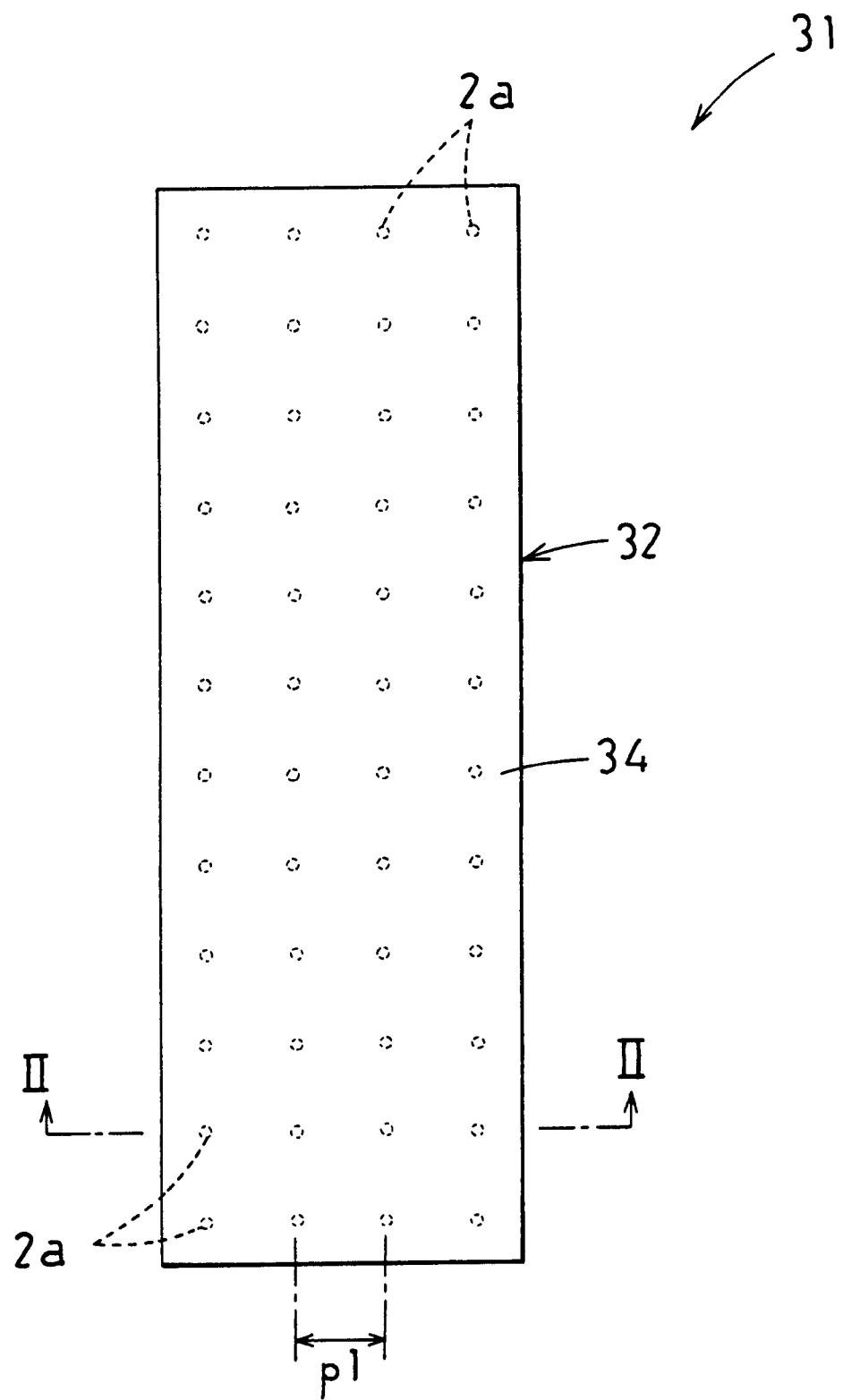
FIG. 8 is a schematic front view of a light emitting display according to Embodiment 3 of the present invention.

A light emitting display of Embodiment 3 of the present invention will be described referring to FIGS. 8 and 9.

The light emitting display of Embodiment 1 or Embodiment 2 having an array of LED lamps embedded in its display body made of a light diffusing resin material (referred to as a solid light emitting display hereinafter) is successfully reduced in the thickness and can illuminate its light emitting display surface uniformly at a desired level of brightness. Therefore, that arrangement is advantageous for use in the display of letters, characters, marks, and patterns of a relatively smaller size. However, it may increase the overall cost when used as a large billboard located on the top of a building structure or the like.

The solid light emitting display allows the LED lamps to be arrayed at equal intervals of a distance or pitch of substantially up to 20 to 25 mm on the display body. When the pitch is increased, the area between any two LED lamps will be dimmed thus generating uneven brightness of the illumination at the light emitting display surface (the front side of the display body). Therefore, when the solid light emitting display is used for building a large sized billboard, a large number of the LED lamps are required hence increasing the overall cost.

The above uneven brightness of the illumination on the light emitting display surface may be overcome by thickening the display body to increase the distance d1 (See FIG. 5) from the top of the LED lamp to the light emitting display surface even when the interval between any two LED lamps is extended. In that case, the display body may undesirably be increased in the weight and the intensity of illumination may be diminished in the display body.

A light emitting display 31 of Embodiment 3 is developed for eliminating the above disadvantages. As best shown in FIG. 9, the light emitting display 31 has a hollow casing 32.

The casing 32 comprises a casing body 33 of a front-opened box-like shape made of a light metal such as aluminum or a light shielding synthetic resin material and a front plate 34 covering and closing the front opening of the casing body 33.

The front plate 34 is made of a light diffusing resin material which comprises a transparent resin doped with a light diffusing agent 12, similar to that of the display bodys 11 and 22 of Embodiments 1 and 2. The thickness of the front plate 34 is not limited, but may preferably be 2 to 3 mm in normal applications. The front plate 34 is tightened to the casing body 33 to shut the opening with the use of appropriate tightening means (not shown) such as screws or an adhesive.

A substrate 35 on which a number of LED lamps 2a are mounted is disposed on the bottom of the casing 32. The substrate 35 may be a printed circuit board having a pattern of circuits (not shown) designed for supplying power to the LED lamps 2a and securely mounted by tightening means such as screws (not shown) to a rear side 33a of the casing body 33.

A light reflective coating 36 is applied by printing, painting, or bonding a film to the LED lamp mounting side (facing the front plate 34) of the substrate 35. The surface of the light reflective coating 36 forms a light reflective surface 37 specified in the present invention. The light reflective surface 37 is not limited to a particular color, but may preferably be white.

The LED lamps 2a mounted on the substrate 35 are substantially identical to those of Embodiments 1 and 2 and are covered at their top with the light reflective coating 10 and arranged with their top facing the front plate 34 at equal intervals of a distance or pitch in rows and columns. In Embodiment 3, the pitch p1 (See FIG. 8) between any two LED lamps 2a is about 50 mm and the distance d2 (See FIG. 9) from the top of each LED lamp 2a to the outer side 34a (a light emitting display surface) of the front plate 34 is set to about 50 mm.

Also, Embodiment 3 has a light reflective coating 38 provided on the inner side of each side wall 33b of the casing body 33. The surface of the light reflective coating 38 incorporates a light reflection surface 39 having, for example, a white color.

Figure 9:
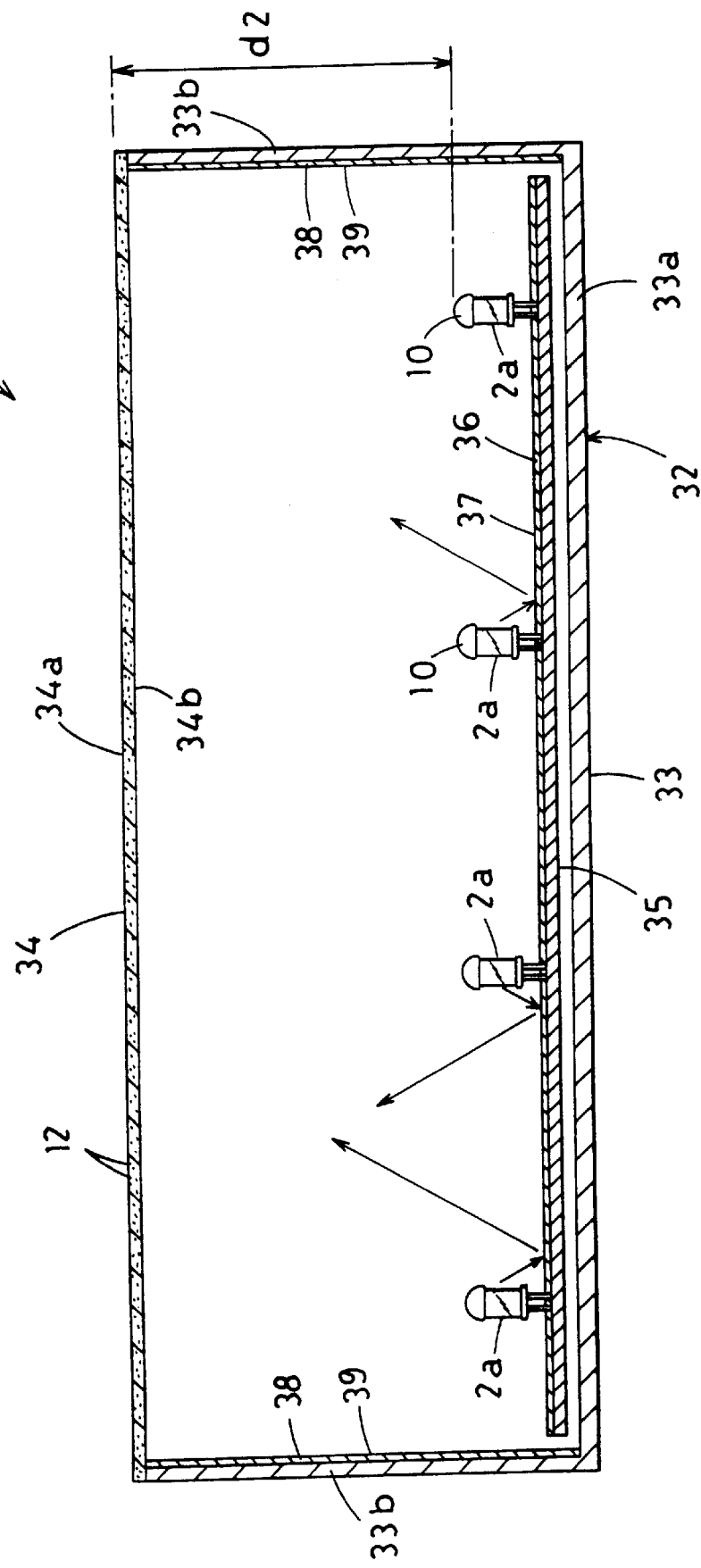
FIG. 9 is an enlarged cross sectional view taken along the line II—II of FIG. 8.

During operation of the light emitting display 31, when the LED lamps 2a are supplied with power from the printed circuits, rearward components of the light emitted from the LED lamps 2a are radiated at angles as denoted by the arrows in FIG. 9, reflected on the light reflective surface 37, and directed at angles toward the front plate 34. As described previously, the rearward components of the light from the LED lamps 2a are randomly directed and their reflections on the light reflective surface 37 propagate at random angles towards the front plate 34. While the reflected light runs through a relatively long distance from the light reflective surface 37 to the front plate 34, they are favorably diffused. Then, the reflected light is incident on the inner side 34b of the front plate 34, passes through the front plate 34, and finally radiates from the upper side 34a (the light emitting display surface) to the outside.

As explained, the light emitting display 31 allows the light emitted from the LED chips to be reflected on the inner surface of the light reflective coating 10 and reflected again on the light reflective surface 37 behind the LED lamps 2a thus to be diffused. Also, while the reflected light travels to the front plate 34, it is further diffused. Accordingly, when the casing 32 is sized to increase the distance from the light reflected surface 37 to the front plate 34, the diffusion of reflected light can be encouraged. In this embodiment, the attenuation of light when traveling a distance which is pertinent to the solid light emitting displays will be prevented.

Favorably, in the light emitting display 31 of Embodiment 3 which has the LED lamps mounted in the hollow casing and a front plate made of a light diffusing resin material (referred to as a hollow light emitting display hereinafter), even when the LED lamps are aligned at intervals of as wide a pitch as 50 to 60 mm, the light emitting display surface can illuminate uniformly at a desired level of brightness throughout its area. This can minimize the number of LED lamps per unit area and hence the overall cost. Also, as the display body filled with the light diffusing resin material of any solid light emitting display is not used, the overall weight of the hollow light emitting display can be lightened.

The hollow light emitting display is advantageously lower in both the cost and the weight and can favorably be applied for fabricating a large sized display screen such as a billboard on a building.

The front plate 34 may be covered with a color film such as the color sheet 25 of Embodiment 2 with equal success.

Also, while the light reflective surface 37 is defined by the light reflective coating 36 on the substrate 35 in Embodiment 3, it may be implemented by using a substrate made of a light reflective material such as a white color resin. As the upper surface of the substrate itself serves as the light reflective surface, the light reflective coating 36 can be eliminated.

Moreover, it is a good idea that while the substrate 35 is made of a transparent material, the casing body 33 is made of a light reflective, opaque white-color resin material to have the inner surface (facing the front plate 34) of its rear wall 33a serving as the light reflective surface. In that case, the rearward light from the LED lamps 2a is passes through the substrate 35 and is then reflected by the inner surface (the light reflective surface) of the rear wall 33a to travel towards the front.

Embodiment 4

A light emitting display of Embodiment 4 of the present invention will now be described together with LED lamps used, referring to FIGS. 10 to 13.

Figure 10:
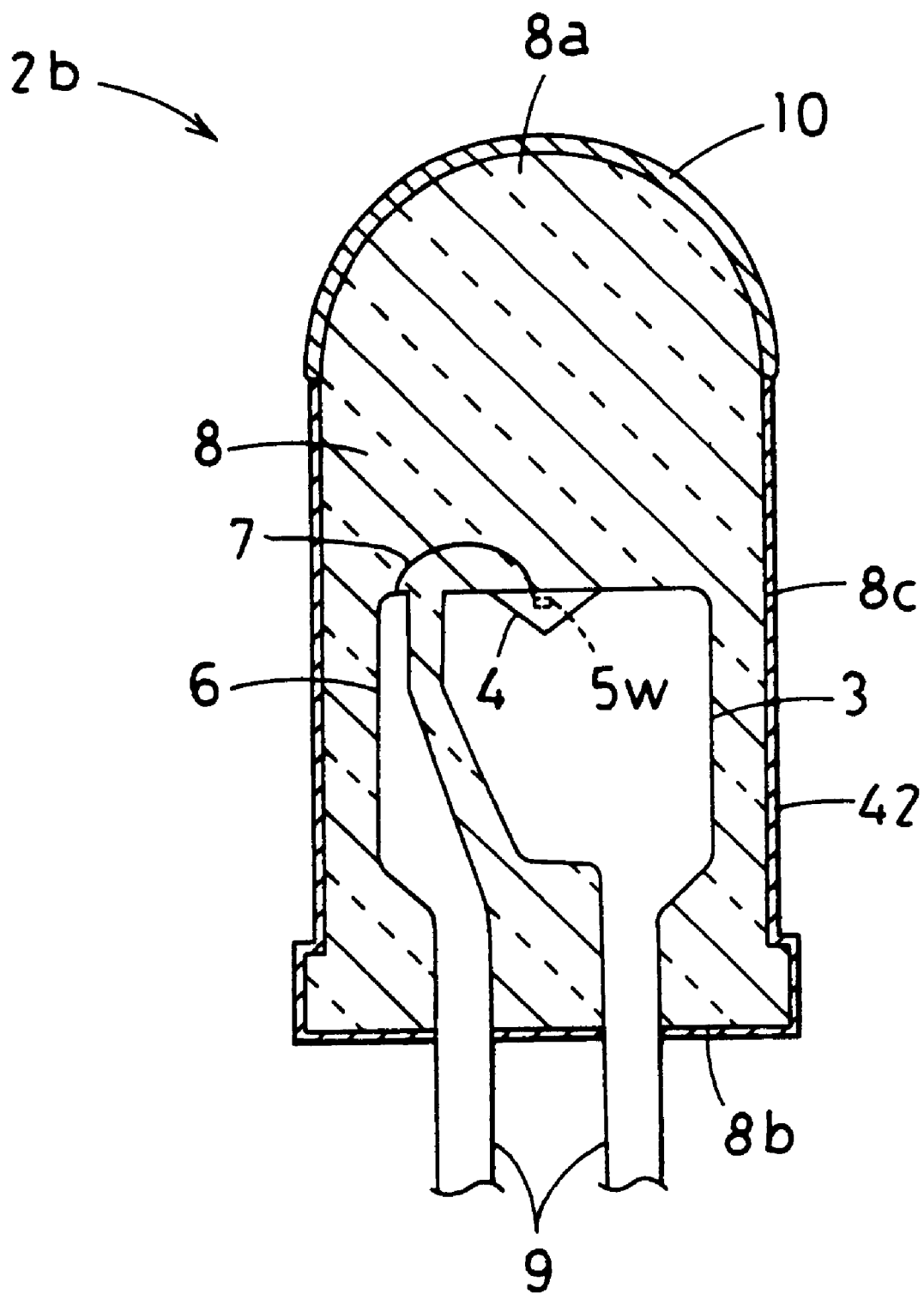
FIG. 10 is a longitudinally cross sectional view of an LED lamp employed in Embodiment 4 of the present invention.

The description starts with an LED lamp shown in FIG. 10. The LED lamp 2b includes a white light LED chip 5w as the LED chip. The white light LED chip in the embodiment means an "LED chip which can emit white light". The white light LED chips include an LED chip of which the radiation is white light and a set of LED chips which emit different color lights which can appear in combination as white light (See Japanese Patent Laid-open Publication 82845 in 2000).

The LED lamp 2b has a light-transmissive, tinted coating 42 provided on the surface (a side 8c and a bottom 8b) of a transparent mold member 8 thereof excluding the top 8a covered with a light reflective coating 10.

The light-transmissive, tinted coating 42 is not limited to a particular fabricating means or method but may be implemented by directly tinting the surface of the mold member 8 with an oil marker pen of a desired color such as blue or yellow. A film of an oil ink from the marker pen turns to the light-transmissive, tinted coating 42. Alternatively, a light-transmissive, tinted film of thin color cellophane may be attached to the surface of the mold member 8 as the light-transmissive, tinted coating 42.

Furthermore, the entire surface of the mold member 8 including the top 8a may be covered with a light-transmissive, tinted coating 42 and then the top 8a only is covered again with the light reflective coating 10.

As described, the LED lamp 2b is identical to the LED lamp 2a except that the white light LED chip 5w is contained and the light-transmissive, tinted coating 42 is applied. Accordingly, like components are denoted by like numerals as those of the LED lamp 2a and will be explained in no more detail.

Figure 11:
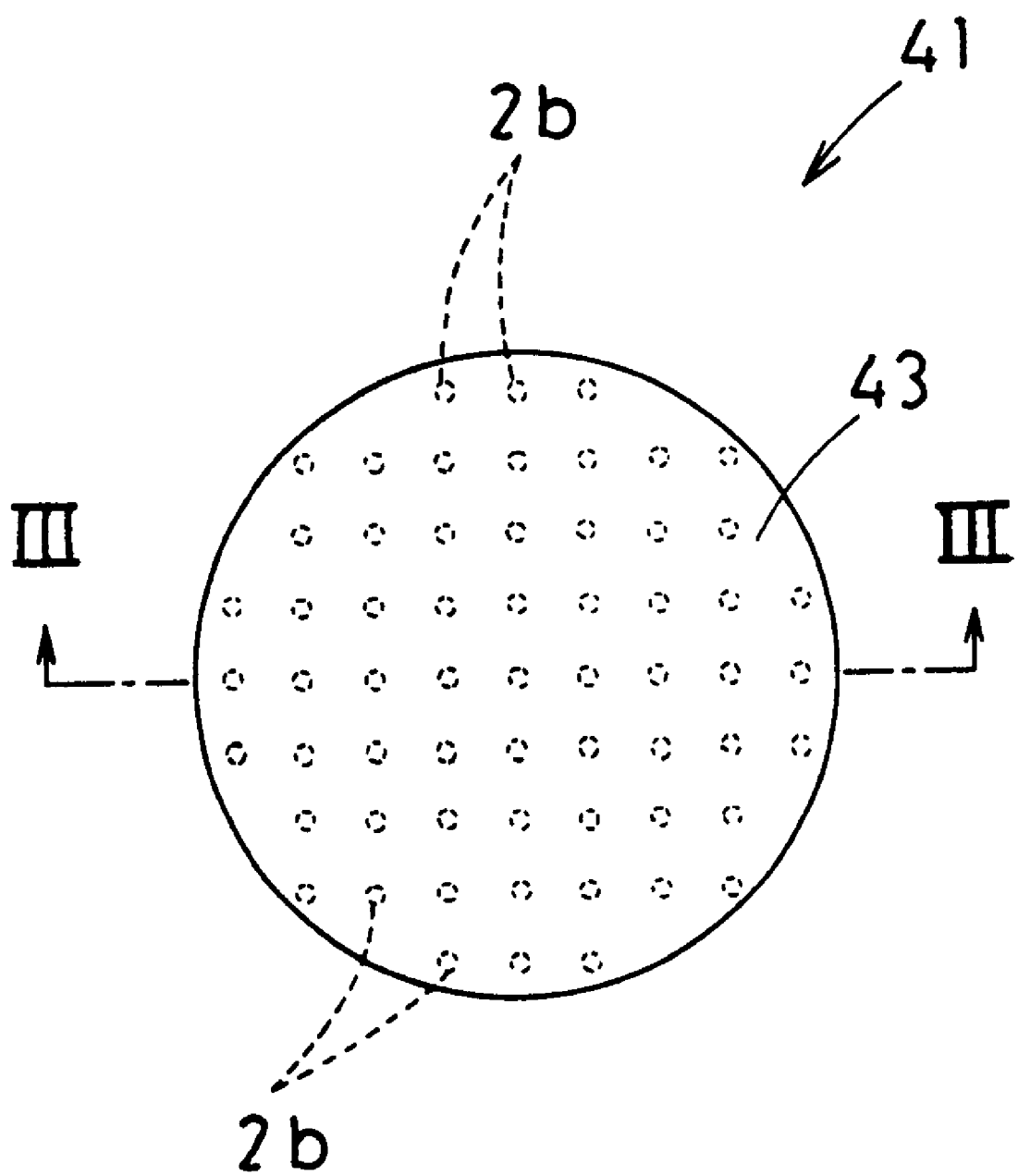
FIG. 11 is a schematic front view of a light emitting display according to Embodiment 4 of the present invention.
Figure 12:
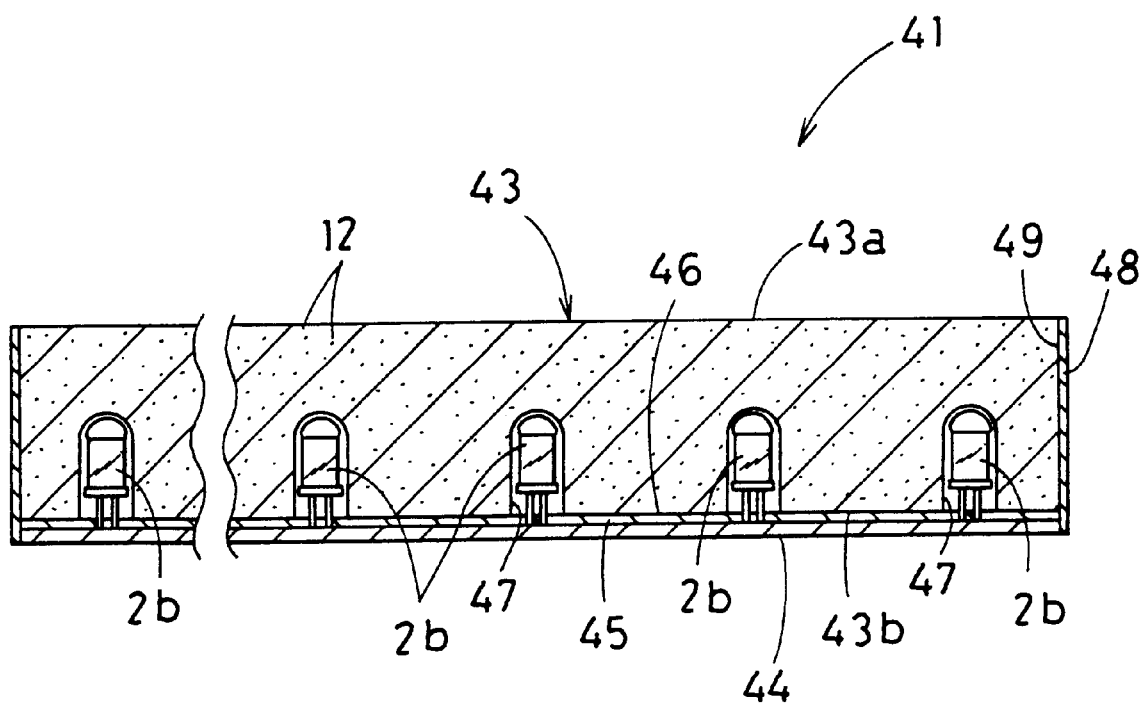
FIG. 12 is a partially unshown enlarged cross sectional view taken along the line III—III of FIG. 11.

The light emitting display of Embodiment 4 using the LED lamps 2b is explained referring to FIGS. 11 to 12.

The light emitting display 41 has a display body 43 of a disk shape made of a milky-white, light diffusing resin material which comprises a transparent resin doped with a light diffusing agent 12.

The LED lamps 2b are arrayed in rows and columns at equal intervals of a distance or pitch of substantially 20 mm as mounted on a substrate 44. The substrate 44 is a printed circuit board similar to the substrate 35 explained with respect to Embodiment 3 and has a disk shape substantially equal in diameter to the display body 43. The LED lamps 2b mounting side of the substrate 44 is covered with a light reflective coating 45 which has a white, light reflective surface 46.

A plurality of lamp accommodating pits 47 are provided at the same intervals as of the LED lamps 2b in the rear side 43b of the display body 43. The substrate 44 is assembled in the display body 43 with its light reflective surface 46 directly facing the rear side 43b of the display body 43 and specifically with the LED lamps 2b accommodated in their corresponding pits 47. The assembly of the display body 43 and the substrate 44 is then covered at the outer surface with a light reflective coating 48 of which the inner surface is a white, light reflective surface 49.

Commercially available LED chip are classified by color into seven types; red, orange, yellow, blue, emerald green, green, and white. It is therefore difficult for conventional light emitting displays to provide illumination of different colors than the above seven colors with their LED lamps strictly determining the color of emitted light at the light emitting display surface.

Advantageously, the light emitting display 41 of this embodiment permits the front side 43a (a light emitting display surface) of its display body 43 to illuminate in a desired color other than the above seven limited colors.

For example, when the light-transmissive, tinted coating 42 is tinted in red, white light emitted from the white light LED chip 5w turns to a light red (pink) color after passing the light-transmissive, tinted coating 42. This allow the light emitting display surface of the light emitting display 41 to illuminate in the pink color.

Similarly, when the light-transmissive, tinted coating 42 is tinted in blue, white light emitted from the white light LED chip 5w turns to a light blue color after passing the light-transmissive, tinted coating 42. This allow the light emitting display surface of the light emitting display 41 to illuminate in the light blue color.

As the light emitting display 41 permits the light-transmissive, tinted coating 42 to illuminate in desired colors by a simple manner, it is able to emit a desired color of light from its light emitting display surface which is hardly feasible with conventional LEDs and specifically, can create soft, intermediate tone colors (so-called pastel colors) at a favorable level.

Even if the surface of the LED lamp having a specific LED chip which can emit other light than white light is covered with the light-transmissive, tinted coating 42, a resultant color is not so clear as of this embodiment. The other light than white light to be emitted is a monotone light and may be more sharply attenuated when passed through the light-transmissive, tinted coating 42 of a different color. In contrast, the white light emitted from the white light LED chip 5w basically includes all the natural colors and can hardly be declined in intensity when passed through the light-transmissive, tinted coating 42.

Figure 13:
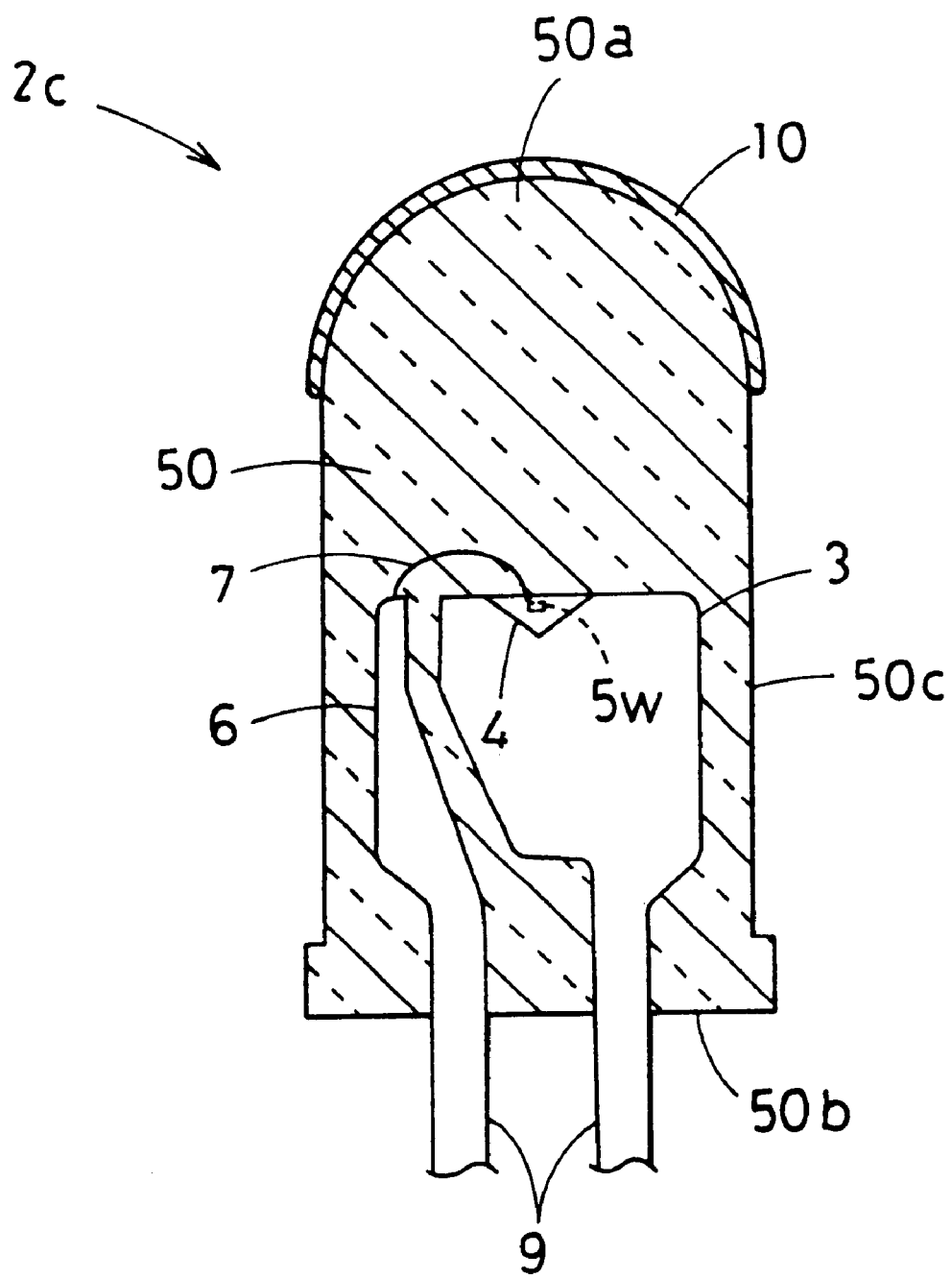
FIG. 13 is a longitudinally cross sectional view of another LED lamp employed in Embodiment 4 of the present invention.

The LED lamp 2b having the light-transmissive, tinted coating 42 may be replaced by an LED lamp 2c shown in FIG. 13.

The LED lamp 2c includes as the LED chip a white light LED chip 5w which is encapsulated in a mold member 50 made of a light-transmissive material such as a transparent resin tinted with a coloring agent. The other arrangement including a light reflective coating 10 provided on the top 50a is identical to that of the LED lamp 2a.

In action, white light emitted from the white light LED chip 5w passes through the mold member 50 and its color turns to an off-white color by the action of the mold member 50 before being radiated from a bottom 50b and a side 50c of the mold member 50.

When the light emitting display 43 employs the LED lamps 2c, the same effect as described above will substantially be given.

Although the light emitting display 43 of Embodiment 4 is of a solid type, its hollow type modification may also be realized with the LED lamps 2b or 2c for exhibiting the equal success.

Embodiment 5

A light emitting display of Embodiment 5 will be described referring to FIGS. 14 to 18.

Figure 14:
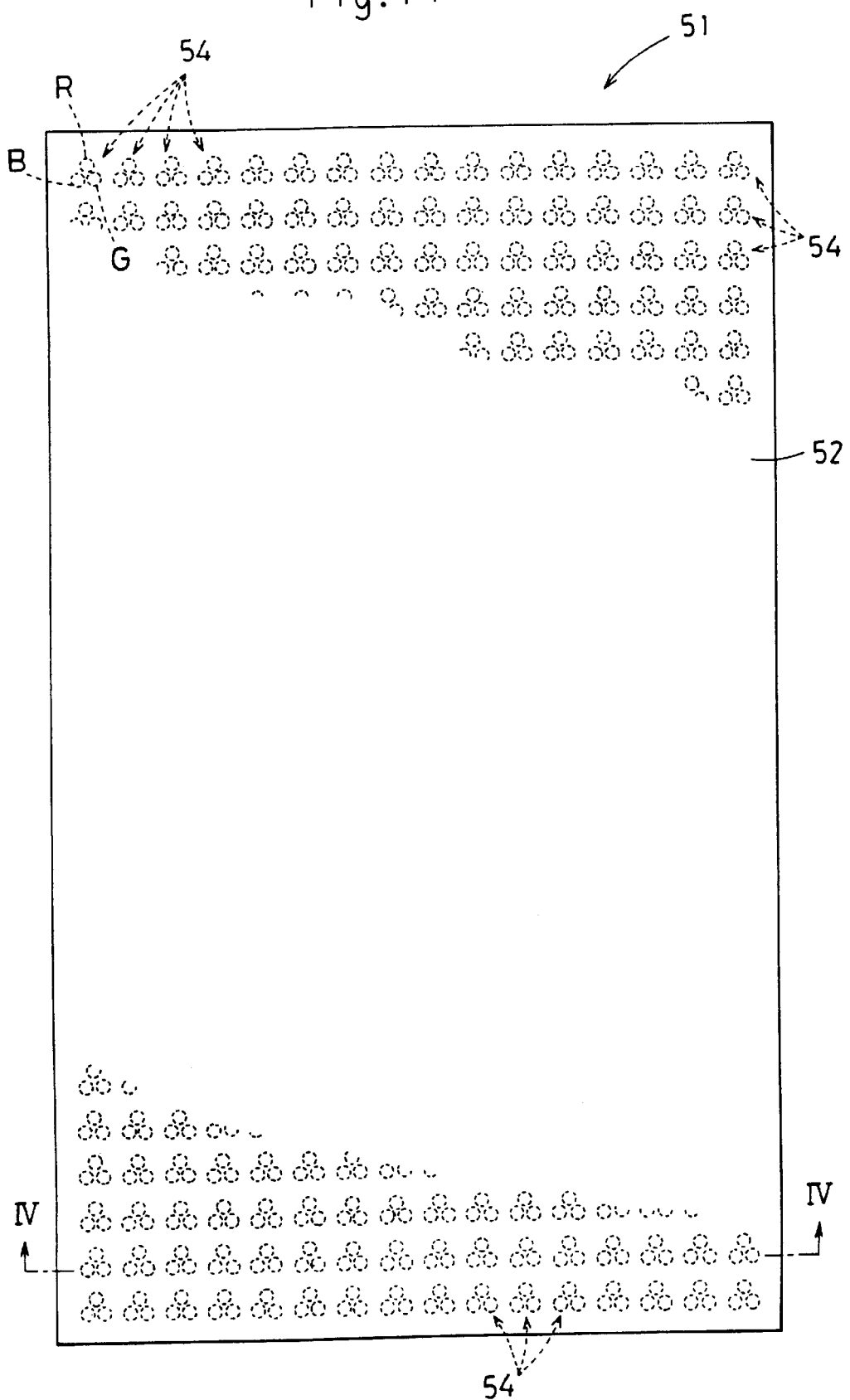
FIG. 14 is a schematic front view of a light emitting display according to Embodiment 5 of the present invention.
Figure 15:
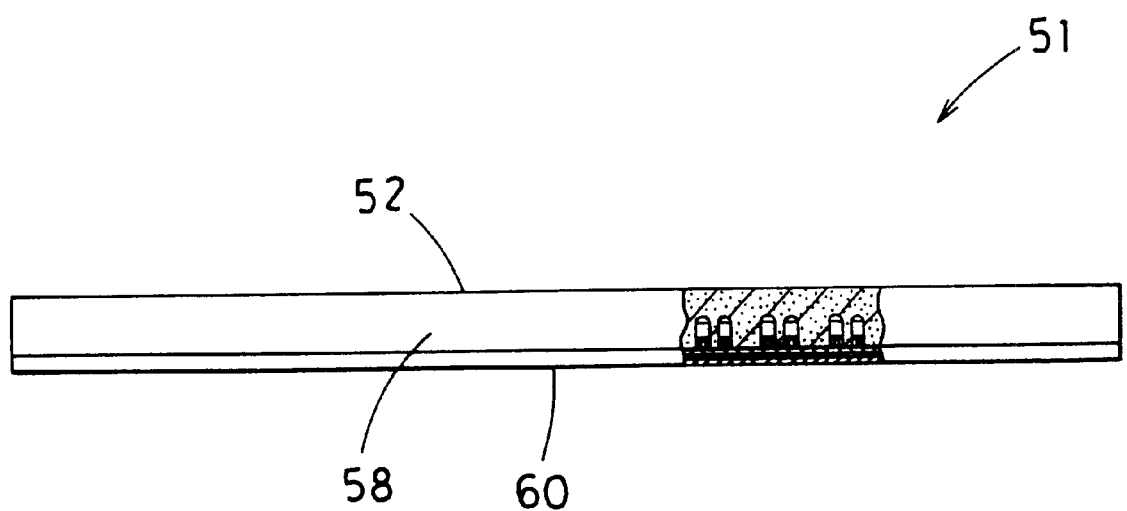
FIG. 15 is a partially cross sectional side view of the light emitting display shown in FIG. 14.

As shown in FIG. 14, the light emitting display 51 of Embodiment 5 includes a display body 52 of a rectangular shape. The display body 52 is fabricated by cutting into a predetermined length a sheet of a light diffusing resin material which comprises a transparent resin such as acrylic resin doped with a fine light diffusing agent 12. Since transmitting light is diffused by the light diffusing agent 12, the display body 52 appears in a milky white color. The transparent resin and the light diffusing agent to be employed are substantially equal to those described with Embodiment 1.

In the figure, the letter R represents a red color LED lamp, G represents a green color LED lamp, and B represents a blue color LED lamp. The LED lamps are basically identical in the construction, including the light reflective coating 10, to the LED lamp 2a shown in FIGS. 1 and 2. The LED chips 5 encapsulated in the mold member 8 are different in the color of light to be emitted.

More particularly, the red color LED lamp R includes a red color LED chip, the green color LED lamp G includes a green color LED chip, and the blue color LED lamp B includes a blue color LED chip.

The LED lamps R, G, and B coated at the top with the light reflective coatings 10 are mounted on one side of a substrate (a printed circuit board) 53 which is substantially equal in both the length and the width to the display body 52 as installed in the display body 52.

Figure 17:
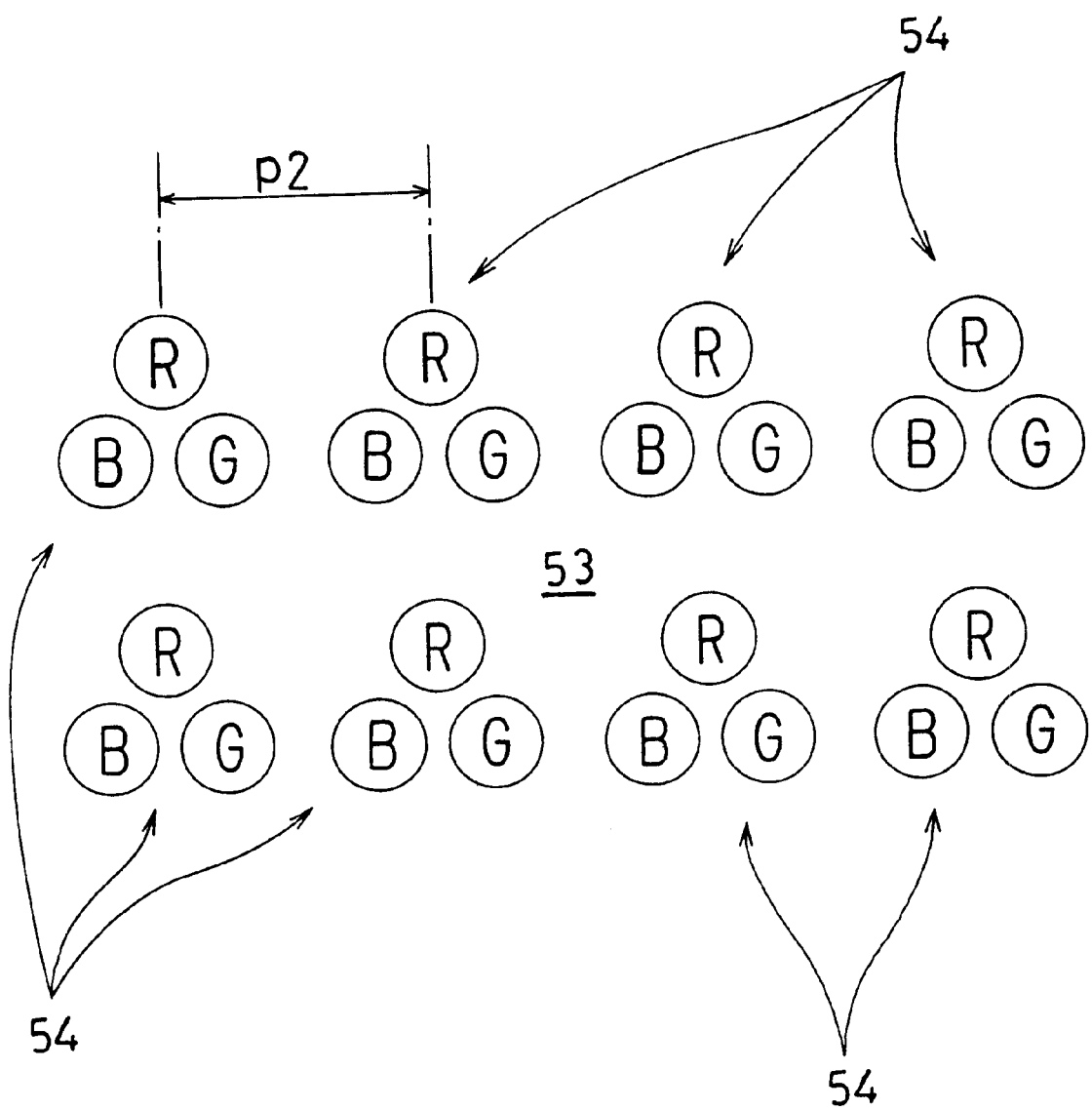
FIG. 17 is an explanatory view illustrating an arrangement of LED lamps in Embodiment 5 of the present invention.

FIGS. 14 and 17 illustrate an array of the LED lamps R, G, and B. A red color LED lamp R, a green color LED lamp G, and a blue color LED lamp B are closely grouped to form a triangle lamp unit 54.

A number of the triangle lamp units 54 are arrayed in rows and columns at equal intervals of a distance or pitch p2 (See FIG. 17).

While a matrix of the LED lamps R, G, and B are mounted on the substrate 53, a plurality of lamp accommodating pits 55 are provided in the rear side 52b of the display body 52 (See FIG. 16) corresponding to the location of the LED lamps R, G, and B. The substrate 53 is joined to the rear side 52b of the display body 52 with their LED lamps accommodated in the corresponding lamp accommodating pits 55, hence allowing the LED lamps to be installed in the display body 52.

The space between the LED lamp and its lamp accommodating pit 55 may be filled with a transparent filler such as an epoxy resin.

Figure 16:
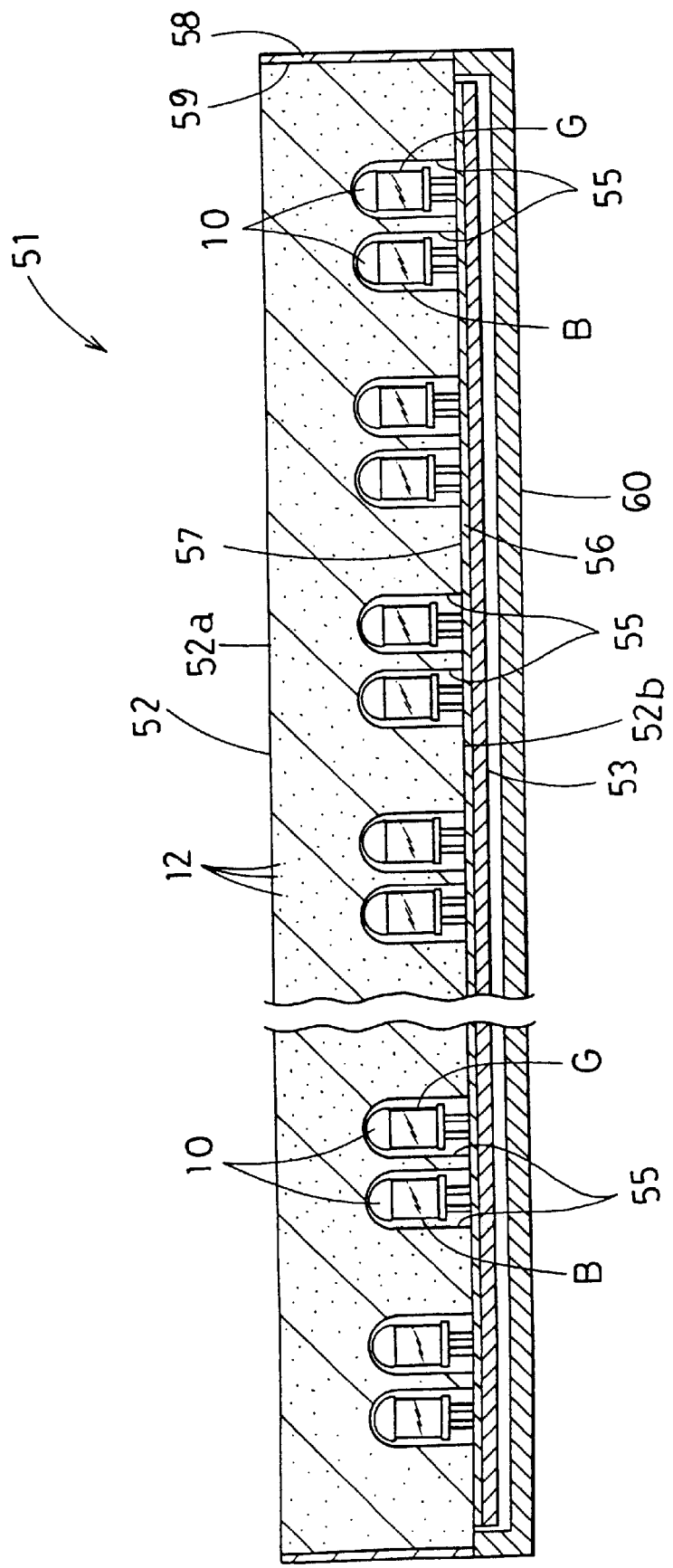
FIG. 16 is a partially unshown enlarged cross sectional view taken along the line IV—IV of FIG. 14.

As best shown in FIG. 16, a light reflective coating 56 is provided on the rear side 52b of the display body 52. The light reflective coating 56 of Embodiment 5 is applied by silk printing a white ink pattern on the LED lamp mounting surface of the substrate 53 while the surface of the light reflective coating 56 incorporates a light reflective surface 57.

Also, a light reflective coating 58 made of a length of white color tape or a white color paint covers the side walls of the display body 52. A cover member 60 made of a metal or synthetic resin material protects the bottom of the display body 52.

The light reflective coating 56 may be applied by painting the rear side 52b of the display body 52 with a white color paint. In that case, great care should be taken for carrying out the painting so as not to fill the lamp accommodating pits 55, hence reducing the efficiency of the process. The printing of the light reflective coating 56 on the lamp mounting surface of the substrate 53 is much simpler to perform the process at ease and will be favorable for mass production.

Figure 18:
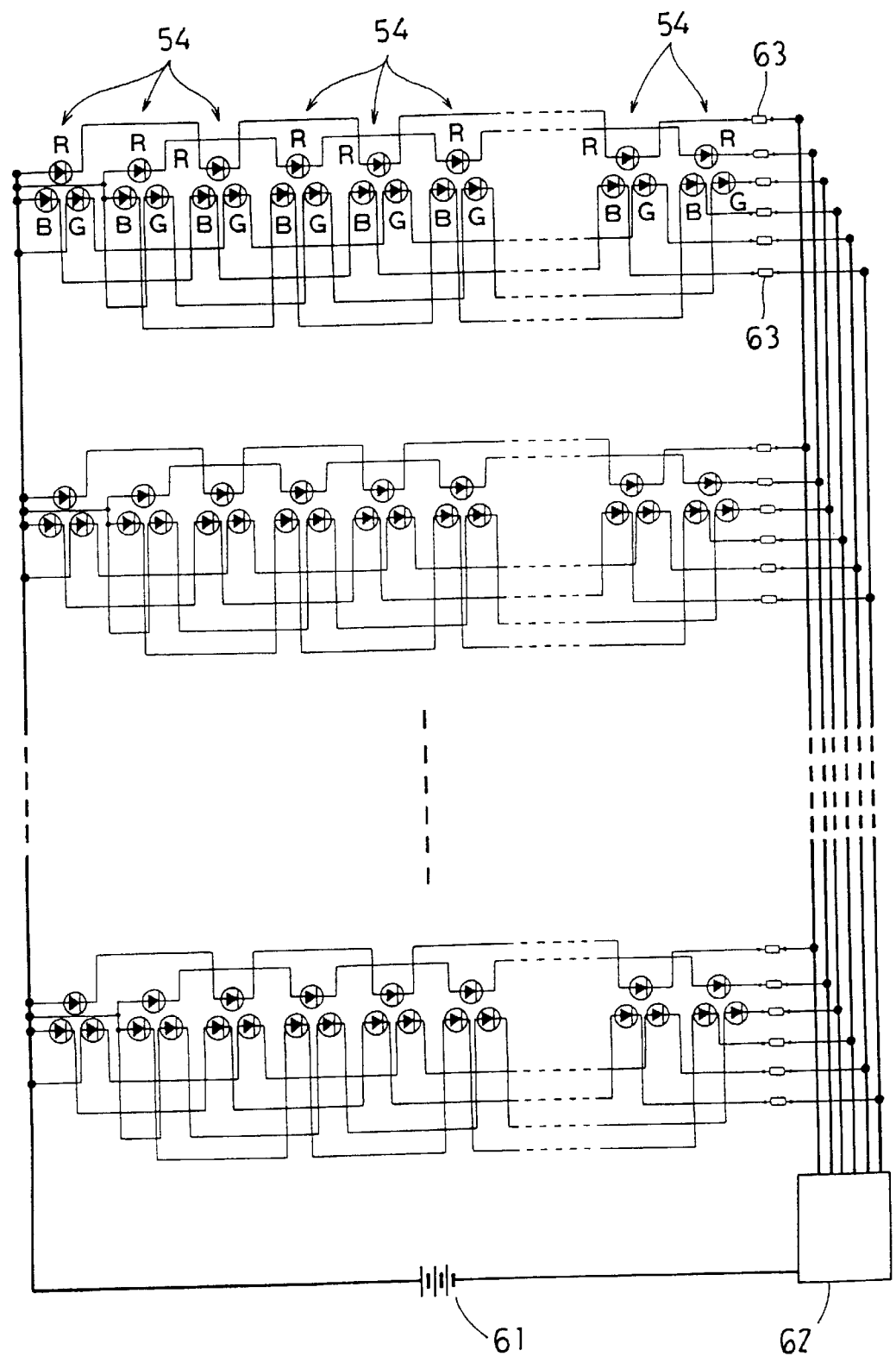
FIG. 18 is a circuit diagram of a power supply used in the light emitting display shown in FIG. 14.

FIG. 18 illustrates a circuit for energizing the LED lamps of the light emitting display 51, including a direct current source 61, a controller 62, and resistors 63 for balancing the brightness of light emitted from the LED lamps. As partially shown in FIG. 18, the lamp units 54 are arrayed vertically in 26 rows, each row having 16 units.

As shown in FIG. 18, corresponding color LED lamps in the 16 lamp units 54 in each row are alternately connected to one another in series.

More specifically, for example, the eight red color LED lamps in the first, third, fifth, ... and the fifteenth lamp units 54 are connected in series to one another while the other eight red color LED lamps in the second, fourth, sixth, ... and the sixteenth lamp units 54 are connected in series to one another. Similarly, the 16 green color LED lamps are alternately connected in series to one another and the 16 blue color LED lamps are alternately connected in series to one another. Each group of the eight in-series connected LED lamps are connected to the DC source 61 and the controller 62. Turning on and off of the grouped color LED lamps can thus be controlled by the controller 62.

If it is arranged that light emitted from the LED lamp is directly radiated towards the front side 52a of the display body 52, its diffusion will unsuccessfully be stimulated hence resulting in the non-uniform brightness at the front side 52a (a light emitting display surface). In Embodiment 5, each LED lamp is covered at the top with the light reflective coating 10 and forward light emitted from its LED chip is reflected on the inner surface of the light reflective coating 10 and mostly radiated out in different rearward directions from the bottom or the side of the LED lamp. The radiated light is then diffused by the light diffusing agent 12 as it travels through the display body 52. Upon arriving at the light reflective surface 57, the radiated light is reflected again and directed frontward. The reflected light while passing through the display body 52 is further diffused and finally released from the front side 52a (the light emitting display surface) of the display body 52. As explained, the light emitted from the LED chip is repeatedly reflected and diffused while traveling through a longer distance, allowing the illumination at the light emitting display surface to appear uniform in the brightness throughout the area.

Accordingly, the light emitting display 51 is able to uniformly illuminate the light emitting display surface and allow the LED units R, G, and B to be actuated in any combination of the groups separately or simultaneously in the three colors for illumination in a desired color at the light emitting display surface.

For example, when only the red color LED lamps R are turned on with the other, green and blue, color LED lamps remaining turned off, the light emitting display surface illuminates in red. Also, when the green and blue color LED lamps are turned on with the red color LED lamps remaining turned off, the light emitting display surface illuminates in a mixture of green and blue or emerald green. When the three color LED lamps R, G, and B are all turned on at one time, the light emitting display surface illuminates in white.

As the three different color LED lamps R, G, and B are located closely to each other and grouped in a triangle lamp unit, their simultaneous illumination of two or three colors appears in a combination but not separately at the light emitting display surface. Therefore, a desired color at a uniform brightness is produced throughout the area of the display.

While the illumination is switched from one color to another at once throughout the display of Embodiment 5, the light emitting display may be divided into multiple areas (local regions) with the LED lamps of each area connected to a dedicated controller. Therefore, the LED lamps can be switched on and off for illumination in each color or in each area independently. Accordingly, the display body 52 can illuminate different colors of light in the corresponding areas and also change the color from one to another in each area, thus producing a variety of illumination in colors and patterns. For instance, some of the areas can display a particular pattern of illumination.

It is also a good idea to control the LED lamps for not only turning on and off but also modifying the brightness (luminance) of their color so that more variations of the illumination can be displayed.

In this embodiment, the three primary color LED lamps R, G, and B are located adjacent to each other and grouped in a triangle lamp unit 54 and a plurality of triangle lamp units 54 are arrayed at equal intervals of a predetermined pitch. According to the present invention, the arrangement of the LED lamps of different colors is not limited to such a triangle shaped group but may arbitrarily be determined.

For example, the three color LED lamps R, G, and B may be aligned in a row such as R, G, B, R, G, B, R, G, B, ... at equal intervals of a narrow distance, e.g., 7 mm, with equal success. Also, if the size of the display body is extensive, two or more of the rows of the LED lamps are arranged one after another.

The three primary color LED lamps R, G, and B may also be arranged in a matrix.

According to the present invention, the arrangement of the different color LED lamps is determined, provided that when the three primary colors of the LED lamps R, G, and B are illuminated substantially at once, they appear not separately but in a combination or a white color throughout the area of the light emitting display.

While this embodiment includes the LED lamps for three primary colors, red, green, and blue, any other combination of colors if white light is not required may be illuminated from a desired set of the different color LED lamps. The color lamp unit is not limited to three, R, G, and B, color LED lamps but may consist of two different LED lamps, for example, green and blue, orange and yellow, and so on, and the color lamp units can be arranged at equal intervals of a desired distance as embedded in the display body. In that case, while at least the two original colors of the dedicated LED lamps are directly illuminated, a mixture of the original colors can additionally be displayed on the light emitting display, hence exhibiting a total of three colors.

The display body 52 is not limited to a milky white color of this embodiment but may be tinted in any color, provided that the display body 52 has light transmissive and light diffusing properties. When the display body is desirably tinted, its color can be combined with the dedicated colors of the LED lamps to produce a more generous, complex color.

Although the LED lamps are mounted to the substrate 53 which is then installed in the display body 52 in this embodiment, they may be accommodated directly in corresponding lamp accommodating pits provided in the rear side of the display body. The display body can then be tailored to a desired, more intricate shape matching a letter, a character, or a pattern and connected at their terminals with wire leads.

Embodiment 6

Figure 19:
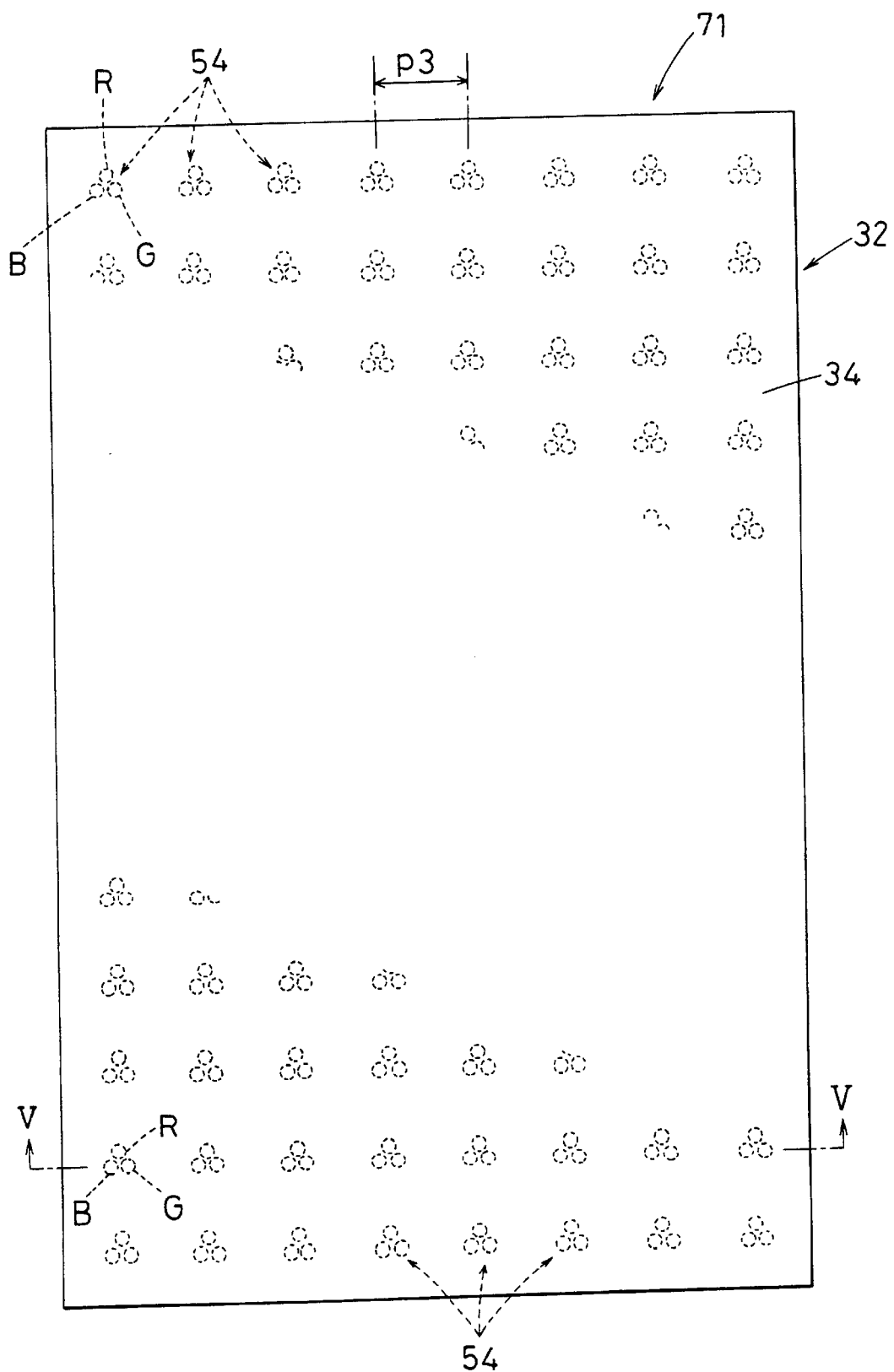
FIG. 19 is a schematic front view of a light emitting display according to Embodiment 6 of the present invention.
Figure 20:
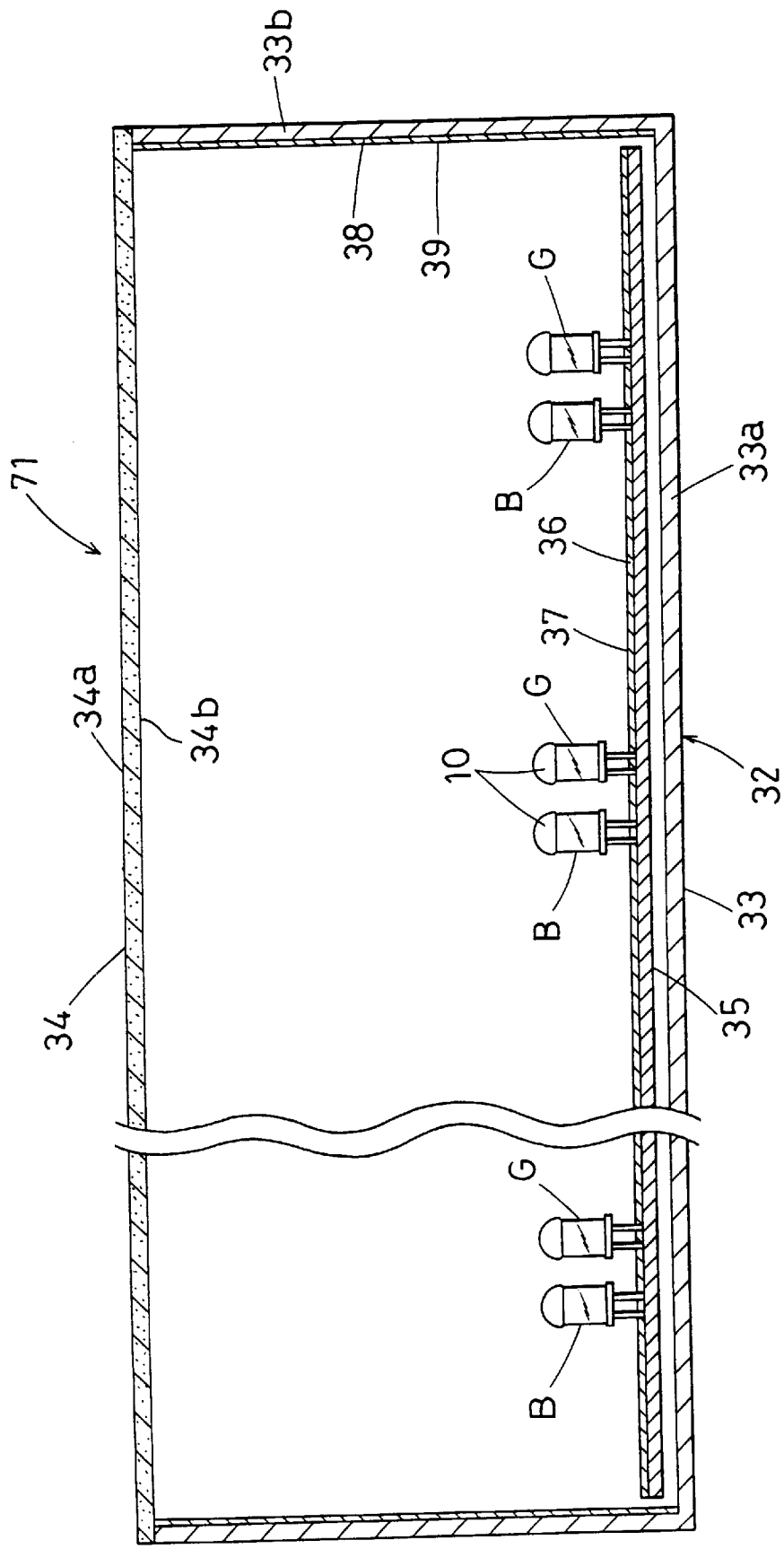
FIG. 20 is a partially unshown enlarged cross sectional view taken along the line V—V of FIG. 19.

A light emitting display of Embodiment 6 will be described referring to FIGS. 19 and 20.

Unlike Embodiment 5 of the solid light emitting display 51 using the three primary color LED lamps, Embodiment 6 provides a hollow light emitting display using the three primary color LED lamps.

The light emitting display 71 of Embodiment 6 includes a hollow body or casing. The casing and its arrangement including a substrate are substantially identical to those of Embodiment 3 shown in FIG. 9, although some small discrepancies are found in the size and dimensions, and their description will not be repeated.

The LED lamps of three primary colors (red, green, and blue) are also identical to those used in the light emitting display 51 and will be denoted by the same letters R, G, and B respectively.

The light emitting display 71 has the LED lamps R, G, and B mounted on a substrate 35 in the casing 32 with their top facing a front plate 34. As shown in FIG. 19, the arrangement of the LED lamps is similar to that of the light emitting display 51, where a number of lamp units 54, each comprising three, R, G, and B, LED lamps grouped close to each other in a triangle relationship, are arrayed in rows and columns at equal intervals of a desired distance or pitch. The pitch p3 between any two adjacent lamp units 54 is set to a range substantially from 40 mm to 60 mm which is wider than the pitch p2 of the solid light emitting display 51.

The light emitting display 71, like the solid light emitting display 51, can illuminate with uniform brightness throughout the light emitting display surface (the front side 34a of the front plate 34), and also allows the R, G, and B color LED lamps to be actuated separately or in a desired combination for shifting the illumination from one color to another.

While its casing 32 has to be increased in thickness (from the light reflective surface 37 to the front plate 34), the hollow light emitting display 71 with its light emitting display surface having comparatively an extended size will favorably be lower in weight and cost than the solid light emitting display 51.

Embodiment 7

A light emitting display of Embodiment 7 of the present invention will now be described together with a three-color LED lamp referring to FIGS. 21 to 23.

Figure 21:
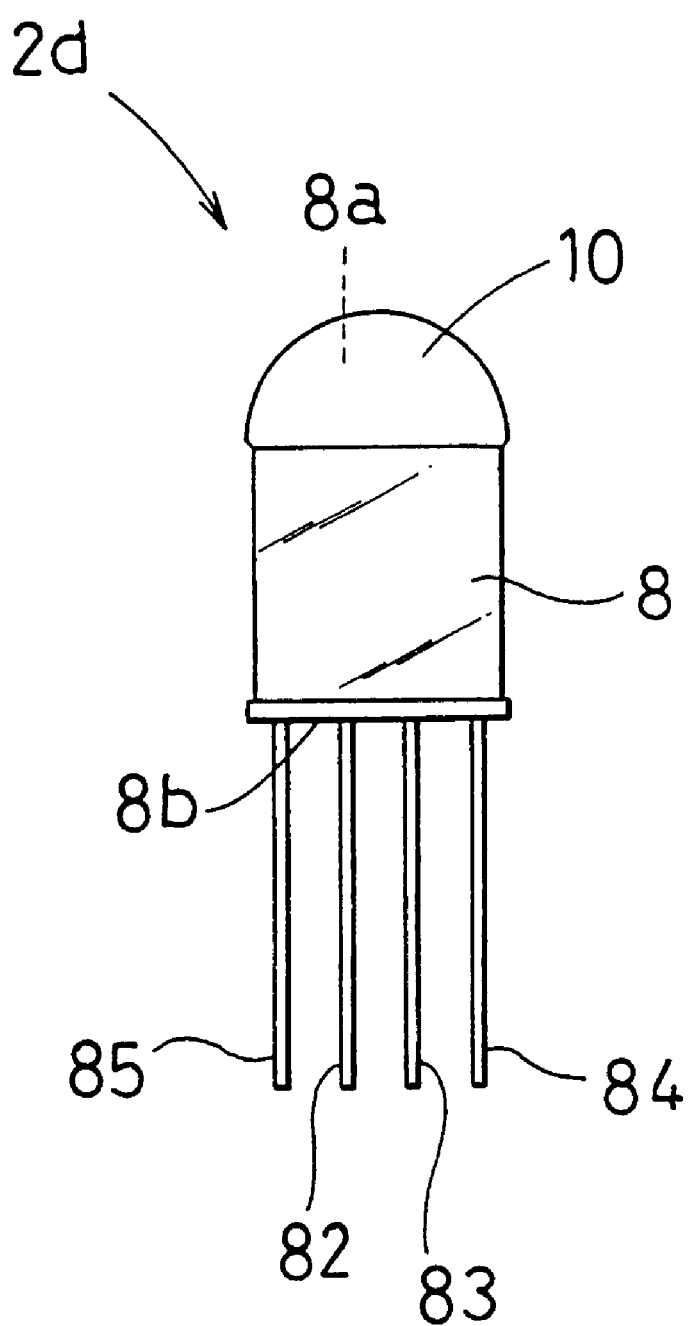
FIG. 21 is a schematic front view of a three-color LED lamp employed in Embodiment 7 of the present invention.

The three-color LED lamp is first explained referring to FIG. 21.

As illustrated not in details, the three-color LED lamp 2d includes three LED chips; an LED chip emitting light of a red color (referred to as a red color LED chip hereinafter), an LED chip emitting light of a green color (referred as a green color LED chip), and an LED chip emitting light of a blue color (referred to as a blue color LED chip). The red color LED chip, the green color LED chip, and the blue color LED chip are encapsulated in a mold member 8 made of a light transmissive material such as an epoxy resin.

Three lead terminals 82, 83, and 84 connected to the anode of the red color LED chip, the anode of the green color LED chip, and the anode of the blue color LED chip respectively are extended together with a lead terminal 85 connected as a common terminal to the cathodes of the three LED chips 82, 83, and 84 outwardly from a bottom 8b of the mold member 8.

In action, when a direct-current voltage is applied between the lead terminals 82 and 85, the three-color LED lamp 2d emits light of a red color. When a direct-current voltage is applied between the lead terminals 83, 84 and the lead terminal 85, the three-color LED lamp 2d emits light of a mixture of green and blue.

The three-color LED lamp 2d is covered at its top 8a with a light reflective coating 10 which is identical to that of the previous embodiments.

Figure 22:
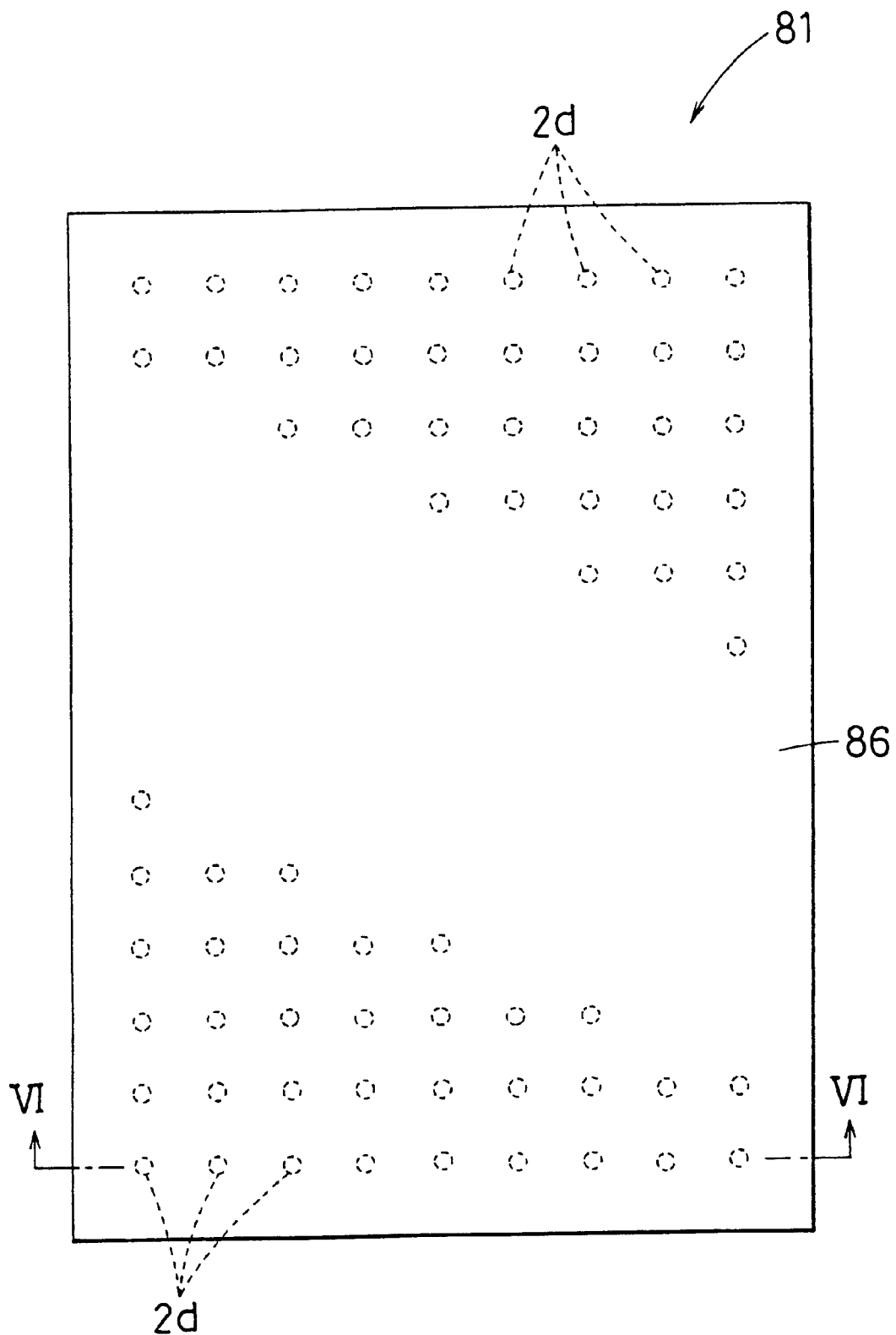
FIG. 22 is a schematic front view of a light emitting display according to Embodiment 7 of the present invention.
Figure 23:
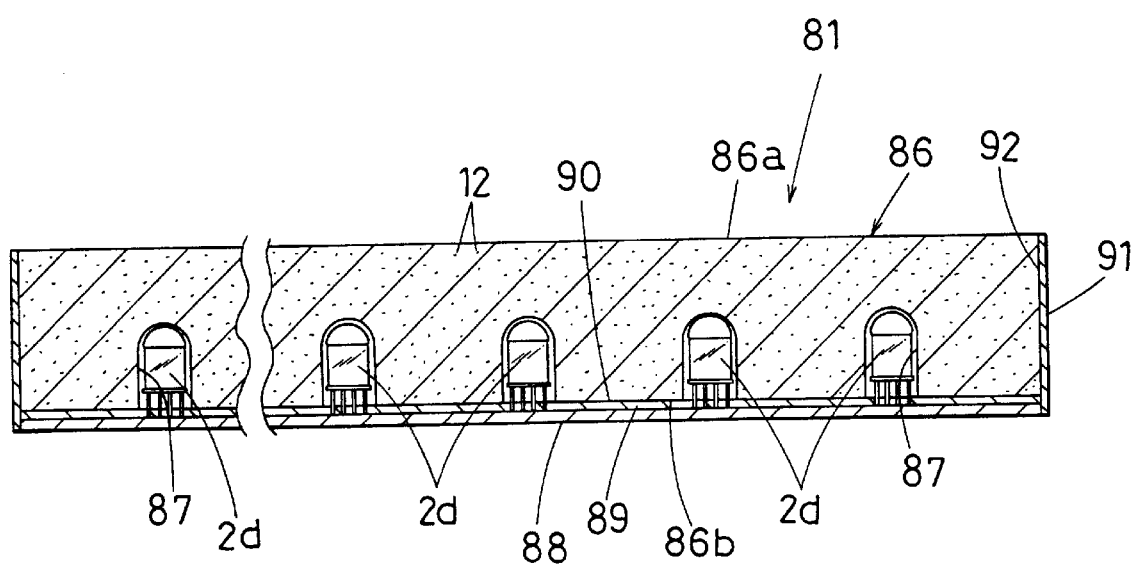
FIG. 23 is a partially unshown enlarged cross sectional view taken along the line VI—VI of FIG. 22.

The light emitting display of Embodiment 7 is now explained referring to FIGS. 22 and 23.

The light emitting display 81 includes a display body 86 made of a sheet of a light diffusing resin material which comprises a transparent resin doped with a light diffusing agent. The display body 86 has a number of lamp accommodating pits 87 provided in the rear side 86b thereof for accommodating the corresponding three-color LED lamps 2d. The three-color LED lamps 2d are mounted to one side of a substrate 88 (a printed circuit board). The LED lamp mounting side of the substrate 88 is covered with a light reflective coating 89 of which the upper surface incorporates a light reflective surface 90. The side walls of the display body 86 are also covered with a light reflective coating 91 of which the inner surface is a light reflective surface 92.

As best shown in FIG. 22, a plurality of the three-color LED lamps 2d are arranged in rows and columns at equal intervals of a distance as encapsulated in the display body 86.

The light emitting display 81, like the light emitting display 51 of the other embodiment, can use a red color, a green color, and a blue color as well as any desired combination of the three colors (including white) to illuminate its light emitting display surface.

Also, the number of LED lamps per unit area on the light emitting display surface (the front side 86a of the display body 86) is reduced to substantially ⅓ the number of LED lamps of the light emitting display 51. While the number of leads is successfully decreased, the drilling of the lamp accommodating pits and the mounting of the LED lamps to the substrate will be minimized thus improving the production rate of the light emitting display 81.

The light emitting displays of the foregoing embodiments may also be decorated with letters, characters, patterns, marks, and other designs applied on its light emitting display surface by printing, painting, sheet bonding, or any other appropriate manner.

It is understood that while the LED lamps of the embodiments are adapted with the top of the mold member shaped to a semi-spherical, lens-like form (known as round-head LED lamps), their shape for use in the light emitting displays of the present invention is not limited to such a shape, and may be a triangle, a flat-face, or any other appropriate configuration covered with the light reflective coating.

What is claimed is:

1. A light emitting display comprising:
 a light emitting display element having a display surface, the light emitting display element being made of a light diffusing resin material which comprises a transparent resin doped with a light diffusing material;
 an LED lamp having a top surface and an LED chip encapsulated in a mold member made of a light transmissive material the LED lamp being disposed behind the display surface of the light emitting display element such that the top surface faces the display surface of the light emitting display element, the top surface of the LED lamp being covered with a light reflective coating; and
 a light reflective surface disposed at a rear side of the LED lamp so as to face the display surface of the light emitting display element.

2. A light emitting display comprising:
 a display body having a front side and being made of a light diffusing resin material which comprises a transparent resin doped with alight diffusing material;
 an LED lamp having a top surface and an LED chip encapsulated in a mold member made of a light transmissive material, the LED lamp being embedded in the display body such that the top surface faces the front side of the display body, the top surface of the LED lamp being covered with a light reflective coating; and
 a light reflective surface disposed on a rear side of the display body so as to face the front side of the display body.

3. A light emitting display comprising:
 a casing including a front plate made of a light diffusing resin material which comprises a transparent resin doped with a light diffusing material;
 an LED lamp having a top surface and an LED chip encapsulated in a mold member made of a light transmissive material, the LED lamp being mounted in the casing such that the top surface faces the front plate of the casing, the top surface of the LED lamp being covered with a light reflective coating; and
 a light reflective surface disposed at a rear side of the LED lamp on the casing so as to face the front plate of the casing.

4. A light emitting display according to claim 1, wherein the light reflective coating covering the top surface of the LED lamp is made of a film of opaque paint.

5. A light emitting display according to claim 2, wherein the light reflective coating covering the top surface of the LED lamp is made of a film of opaque paint.

6. A light emitting display according to claim 3, wherein the light reflective coating covering the top surface of the LED lamp is made of a film of opaque paint.

7. A light emitting display according to claim 4, wherein the paint coating is a film of a white color paint.

8. A light emitting display according to claim 5, wherein the paint coating is a film of a white color paint.

9. A light emitting display according to claim 6, wherein the paint coating is a film of a white color paint.

10. A light emitting display according to claim 1, wherein the LED lamp has a white-light LED chip and a portion of an outer surface of the mold member is covered with a light transmissive tinted coating such that the top surface of the LED lamp is free of the light transmissive tinted coating.

11. A light emitting display according to claim 2, wherein the LED lamp has a white-light LED chip and a portion of an outer surface of the mold member is covered with a light transmissive tinted coating such that the top surface of the LED lamp is free of the light transmissive tinted coating.

12. A light emitting display according to claim 3, wherein the LED lamp has a white-light LED chip and a portion of an outer surface of the mold member is covered with a light transmissive tinted coating such that the top surface of the LED lamp is free of the light transmissive tinted coating.

13. A light emitting display according to claim 1, wherein the LED lamp has a white-light LED chip encapsulated in the mold member, the mold member being made of a light transmissive, tinted material.

14. A light emitting display according to claim 2, wherein the LED lamp has a white-light LED chip encapsulated in the mold member, the mold member being made of a light transmissive, tinted material.

15. A light emitting display according to claim 3, wherein the LED lamp has a white-light LED chip encapsulated in the mold member, the mold member being made of a light transmissive, tinted material.

16. A light emitting display according to claim 1, further comprising a plurality of LED lamps classified into at least two different types, each type being operable to emit a different color of light, the LED lamps being arrayed in a combination at equal intervals of distance.

17. A light emitting display according to claim 2, further comprising a plurality of LED lamps classified into at least two different types, each type being operable to emit a different color of light, the LED lamps being arrayed in a combination at equal intervals of distance.

18. A light emitting display according to claim 3, further comprising a plurality of LED lamps classified into at least two different types, each type being operable to emit a different color of light, the LED lamps being arrayed in a combination at equal intervals of distance.

19. A light emitting display according to claim 1, further comprising a plurality of LED lamps classified into a red color LED lamp type, a green color LED lamp type, and a blue color LED lamp type, the plurality of LED lamps being arrayed in a predetermined arrangement.

20. A light emitting display according to claim 2, further comprising a plurality of LED lamps classified into a red color LED lamp type, a green color LED lamp type, and a blue color LED lamp type, the plurality of LED lamps being arrayed in a predetermined arrangement.

21. A light emitting display according to claim 3, further comprising a plurality of LED lamps classified into a red color LED lamp type, a green color LED lamp type, and a blue color LED lamp type, the plurality of LED lamps being arrayed in a predetermined arrangement.

22. A light emitting display according to claim 1, further comprising a plurality of LED lamps, each LED lamp being a three-color LED lamp having a red color LED chip, a green color LED chip, and a blue color LED chip encapsulated in a single mold member, the LED lamps being arrayed at equal intervals of distance.

23. A light emitting display according to claim 2, further comprising a plurality of LED lamps, each LED lamp being a three-color LED lamp having a red color LED chip, a green color LED chip, and a blue color LED chip encapsulated in a single mold member, the LED lamps being arrayed at equal intervals of distance.

24. A light emitting display according to claim 3, further comprising a plurality of LED lamps, each LED lamp being a three-color LED lamp having a red color LED chip, a green color LED chip, and a blue color LED chip encapsulated in a single mold member, the LED lamps being arrayed at equal intervals of distance.

25. A light emitting display according to claim 1, wherein only the top surface of the LED lamp is covered with the light reflective coating such that light emitted from the LED chip reflects off of the light reflective coating and strikes the light reflective surface.

26. A light emitting display according to claim 2, wherein only the top surface of the LED lamp is covered with the light reflective coating such that light emitted from the LED chip reflects off of the light reflective coating and strikes the light reflective surface.

27. A light emitting display according to claim 3, wherein only the top surface of the LED lamp is covered with the light reflective coating such that light emitted from the LED chip reflects off of the light reflective coating and strikes the light reflective surface.

* * * * *